United States Patent
Campbell

(10) Patent No.: US 8,786,299 B1
(45) Date of Patent: Jul. 22, 2014

(54) ADHERABLE HOLDER AND LOCATER TOOL

(71) Applicant: Teledyne LeCroy, Inc., Thousand Oaks, CA (US)

(72) Inventor: Julie A. Campbell, Beaverton, OR (US)

(73) Assignee: Teledyne LeCroy, Inc., Thousand Oaks, CA (US)

(*) Notice: Subject to any disclaimer, the term of this patent is extended or adjusted under 35 U.S.C. 154(b) by 0 days.

(21) Appl. No.: 13/863,338

(22) Filed: Apr. 15, 2013

Related U.S. Application Data

(63) Continuation of application No. 13/292,080, filed on Nov. 8, 2011, now Pat. No. 8,421,488, which is a continuation of application No. 12/180,500, filed on Jul. 25, 2008, now Pat. No. 8,134,377, which is a continuation-in-part of application No. 11/286,787, filed on Nov. 22, 2005, now abandoned.

(60) Provisional application No. 60/712,930, filed on Aug. 31, 2005.

(51) Int. Cl.
  *G01R 31/01* (2006.01)
  *G01R 1/04* (2006.01)

(52) U.S. Cl.
  CPC .................................. *G01R 1/0408* (2013.01)
  USPC ............ 324/750.22; 324/754.11; 324/750.16; 324/762.02; 324/763.01; 73/866.5

(58) Field of Classification Search
  USPC ............. 324/754.11, 750.22, 750.16, 762.02, 324/763.01; 73/866.5
  See application file for complete search history.

(56) References Cited

U.S. PATENT DOCUMENTS

| | | | |
|---|---|---|---|
| 3,500,192 A * | 3/1970 | Donaher et al. ............. | 324/72.5 |
| 3,731,191 A | 5/1973 | Bullard et al. | |
| 3,851,249 A | 11/1974 | Roch | |
| 4,056,777 A | 11/1977 | Roch | |
| 4,336,496 A | 6/1982 | Schnabl et al. | |
| 4,343,092 A | 8/1982 | Wahl et al. | |

(Continued)

FOREIGN PATENT DOCUMENTS

| | | |
|---|---|---|
| EP | 0232614 | 8/1987 |
| GB | 1175195 | 12/1969 |
| JP | 2000170994 | 6/2000 |

OTHER PUBLICATIONS

Cascade Microtech Inc., "Universal Probe Holder," mttab, at least as early as Oct. 31, 2005, 1 page, http://www.mttab.se/index.php-?prodkate=699&prodid=5872.

(Continued)

*Primary Examiner* — Patrick Assouad
*Assistant Examiner* — Sean Curtis
(74) *Attorney, Agent, or Firm* — Law Office of Karen Dana Oster, LLC

(57) ABSTRACT

An assistive fine positioning support device for positioning and/or holding a test probe tip (the test probe tip being distanced from the probing head). The support device includes at least one positionable support member having a first support end and a second support end. A tip adapter at the first support end is for connecting the test probe tip to the at least one positionable support member, the tip adapter being in direct contact with the test probe tip. The second support end having means for holding and securing to a surface supporting an electrical component to be probed.

22 Claims, 21 Drawing Sheets

(56) References Cited

U.S. PATENT DOCUMENTS

| | | | |
|---|---|---|---|
| 4,806,856 A | 2/1989 | Hvezda et al. | |
| 4,964,221 A | 10/1990 | Breyer et al. | |
| 4,975,638 A * | 12/1990 | Evans et al. | 324/754.14 |
| 5,003,254 A | 3/1991 | Hunt et al. | |
| 5,189,797 A | 3/1993 | Granger | |
| 5,291,662 A | 3/1994 | Matsumiya et al. | |
| 5,343,628 A | 9/1994 | Ham | |
| 5,387,872 A | 2/1995 | Nightingale | |
| 5,446,393 A | 8/1995 | Schaefer | |
| 5,461,325 A | 10/1995 | Duggan | |
| 5,489,855 A | 2/1996 | Poisel | |
| 5,923,178 A | 7/1999 | Higgins et al. | |
| 6,008,757 A | 12/1999 | Boulianne et al. | |
| 6,023,171 A | 2/2000 | Boyette, Jr. et al. | |
| 6,285,180 B1 | 9/2001 | Pas | |
| 6,307,389 B1 | 10/2001 | Buks et al. | |
| 6,459,287 B1 | 10/2002 | Nightingale et al. | |
| 6,462,529 B1 | 10/2002 | Campbell | |
| 6,556,004 B2 | 4/2003 | Okuno et al. | |
| 6,653,825 B2 | 11/2003 | Munniksma | |
| 6,788,086 B2 | 9/2004 | Hantschel et al. | |
| 6,856,126 B2 * | 2/2005 | McTigue et al. | 324/72.5 |
| 6,927,079 B1 | 8/2005 | Fyfield | |
| 7,084,656 B1 * | 8/2006 | Khandros et al. | 324/750.26 |
| 7,091,730 B1 | 8/2006 | Parshotam et al. | |
| 7,250,782 B2 | 7/2007 | Romanov et al. | |
| 2003/0233126 A1 * | 12/2003 | Kaplan et al. | 607/3 |
| 2004/0201388 A1 * | 10/2004 | Barr | 324/754 |
| 2005/0280427 A1 | 12/2005 | Lou et al. | |

OTHER PUBLICATIONS

AG Devices of Colorado, Inc., "SMD Scope Probe Connections: The QuickProbe Way," at least as early as Oct. 31, 2005, 2 pages, Cedaredge, CO.

LeCroy Corporation, "LeCroy Application Brief—No. LAB1012—Probing LVDS Signals—Functional Testing of LVDS Bus Signals Using HPF Probes," at least as early as Oct. 31, 2005, 3 pages.

TDA Systems, "QuickTDR Probe," at least as early as Oct. 31, 2005, 2 pages, Lake Oswego, Oregon.

Tektronix, "Articulated Arm—PPM203B * PPM100," at least as early as Nov. 19, 2005, 3 pages, Beaverton, Oregon.

Tektronix, "Articulated Arm—PPM203B * PPM007," at least as early as Oct. 31, 2005, 1 page, Beaverton, Oregon.

Testmart, "Articulated Arm—PPM007 Stock Photos," at least as early as Sep. 25, 2004, 1 page, http://www.testmart.com/estore.

* cited by examiner

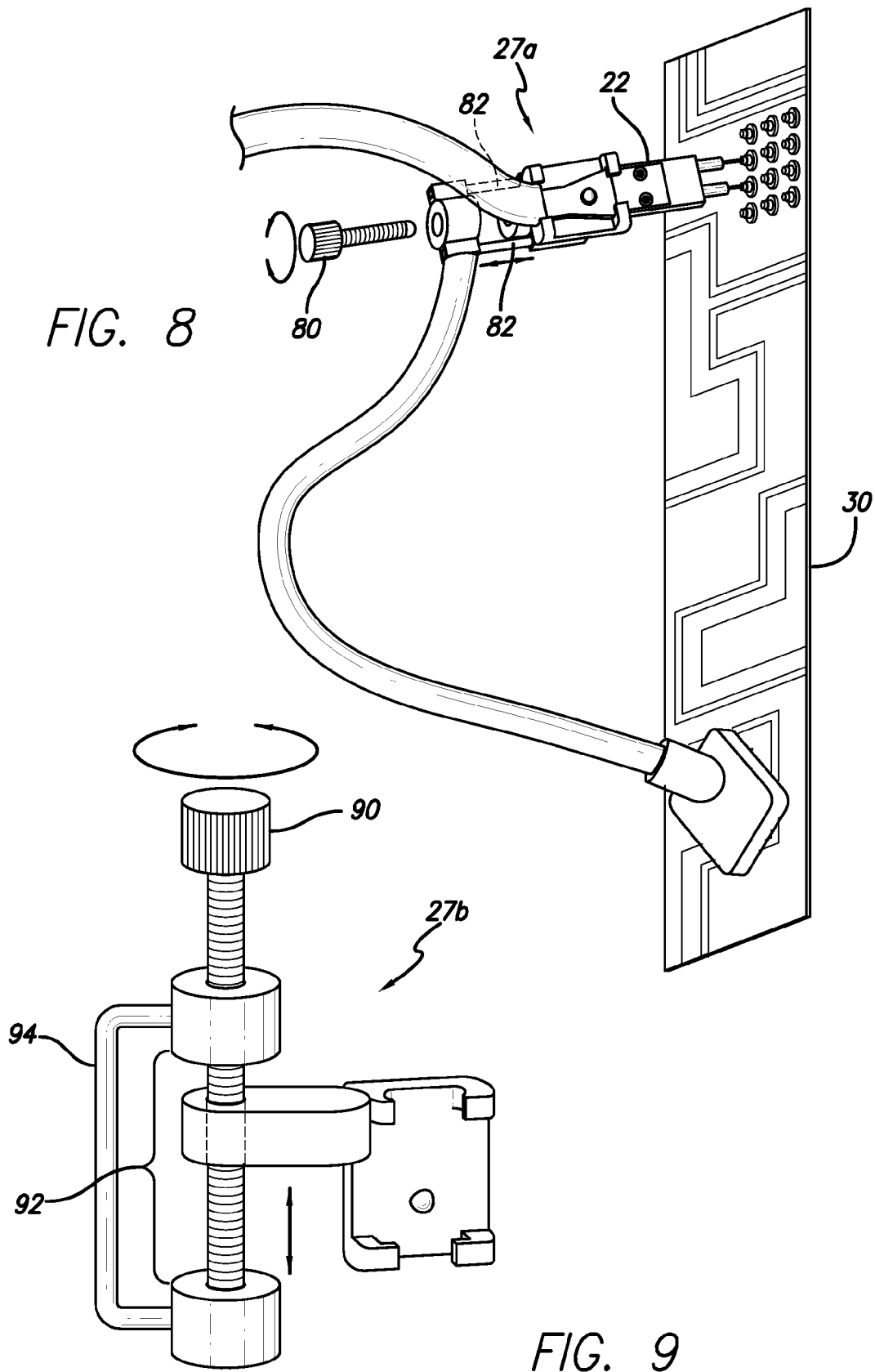

ADHERABLE HOLDER AND LOCATER TOOL

The present application is a continuation of U.S. patent application Ser. No. 13/292,080, filed Nov. 8, 2011, now U.S. Pat. No. 8,421,488. U.S. patent application Ser. No. 13/292,080 is a continuation of U.S. patent application Ser. No. 12/180,500, filed Jul. 25, 2008, now U.S. Pat. No. 8,134,377. U.S. patent application Ser. No. 12/180,500 is a continuation-in-part of U.S. patent application Ser. No. 11/286,787, filed Nov. 22, 2005, now abandoned. U.S. patent application Ser. No. 11/286,787 is an application claiming the benefit under 35 USC Section 119(e) of U.S. Provisional Patent Application No. 60/712,930, filed Aug. 31, 2005. The present application is based on and claims priority from these applications, the disclosures of which are hereby expressly incorporated herein by reference.

BACKGROUND OF INVENTION

The present invention relates generally to a support device that allows for hands-free operation of an electrical test probe. The support device is preferably adherable and may be used with a locater tool.

Electrical test probes are used to provide an electrical connection between electrical components and testing instruments such as oscilloscopes and other measuring, monitoring, diagnostic, and signal processing instruments. An electrical test probe generally consists of a probing head (also referred to as a "test probe head"), a cable, and a testing instrument connector. The probing head may have an integral or replaceable electrical test probe tip that is suitable for making an electrical contact with electrical components. A probe tip can be described as input structure, but would not include an amplifier. The testing instrument connector is suitable for connecting to a testing instrument. The probing head is attached to a first end of the cable and the testing instrument connector is attached to the opposite end of the cable.

To maintain contact with traces, leads, legs, pins, vias, or other connection points of electrical components, a test probe tip must be held in place after it is positioned. Generally a user uses at least one hand to place (position and hold) the traditional test probe tip. With only one unoccupied hand, the user is presented with significant logistic problems. For example, it is difficult or impossible for a single user to monitor multiple channels. Another example is that it is difficult or impossible for a single user to monitor a single channel and simultaneously make adjustments to an oscilloscope. It is also difficult or impossible for a single user to place the test probe tip and solder it in place and/or provide solder in reinforcement.

One solution to the problem of positioning and holding test probes is to use alternative test probe tips. One type of alternative test probe tip is a grabber tip that can be used to grab or grip certain types of electrical components. A securely placed grabber tip can generally maintain its position without being held by the user. If the grabber tip is used with a light-weight probing head, then the user is able to use the combination "hands free." Grabber tips, however, tend to limit bandwidth performance because the mechanism for securing the grabber tip is inside the signal path. Grabber tips are also not very adaptable, are delicate, are expensive, are harder to find than traditional test probe tips, and pose significant electrical issues.

Another solution is the use of an off-board device for positioning and holding test probes. An off-board solution is a device that is generally located far from the contact point to be probed (far proximity). Off-board devices are generally heavy so that they can be stabilized using gravity. One exemplary off-board solution is known as the PROBE BUDDY™. The PROBE BUDDY™ has a bendable "neck" with a weighted "foot" at one end and a holder at the other end. The holder holds the probing head. A user can bend the neck until it is in the correct position to hold the test probe tip of the probing head in electrical contact with the electrical component to be probed. Because of its weight, the foot is positioned off the circuit board. This requires extra space substantially adjacent the circuit board. In actual use, the PROBE BUDDY™ is hard to position correctly.

Another problem with using test probes occurs when a difficult connection is finally made and then the circuit board shakes or the user sneezes. If the circuit board is even slightly knocked, the connection is lost. Grabber tips can be used to solve this problem. Off-board solutions such as the PROBE BUDDY™, however, would hold the probing head in place while the circuit board moves. The relative movement between the tip and the board would cause the connection to be lost.

Some of the problems of the PROBE BUDDY™ have been solved by devices such as those disclosed in European Patent Application No. 0232614A1 to Janko (the "Janko reference") and U.S. Pat. No. 6,462,529 to Campbell (the "Campbell reference"), both of which disclose devices for supporting a probing head on a circuit board. These devices can be thought of as medium proximity solutions. Because they are lightweight, they can sit onboard the surface of the circuit board. However, they still use gravity to keep the connection.

The Janko reference is directed to a probing head having a test probe tip and two integral legs that together form a tripod that supports the probing head. The two legs may include nonskid tip surfaces or end pieces or boots made from a soft, non-slip material. The Janko device, however, is extremely limited in that it is an integral unit. In other words, the entire unit must be purchased and used as a whole. Old test probes that are still functional could not take advantage of the legs. Further, if the Janko device did not have a desired test probe tip, the user would be forced to choose a test probe tip Janko did have or not to use the legs. The Janko device is also directed to a downwardly extending tip and legs extending laterally in the same general direction as the tip. This configuration limits the Janko device to uses where the surface to be probed is the upper surface of a component.

The Campbell reference is directed to legs for forming a tripod with an electrical test probe tip. The legs and test probe tip both may be positioned on the circuit board such that they support the probing head for hands-free operation of an electrical test probe. The Campbell device preferably includes at least one support member and an adapter. The adapter is for connecting the support members to the electrical test probe. The support members and the test probe tip of the electrical test probe together form a tripod to support the electrical test probe for hands-free operation.

The Janko and Cambell devices both work on the principle that the entire probing head is supported on the circuit board. But as circuit boards become more crowded (or shrink in size), there is less room for these types of support devices.

Another solution is the Cascade Microtech Inc. probe holder. The Microtech Inc. probe holder, however, is not really suitable for manual probing, is complicated to use, and is very expensive.

BRIEF SUMMARY OF THE INVENTION

The present invention relates generally to a support device that allows for hands-free operation of an electrical test probe. The support device is preferably adherable and may be used with a locater tool.

Recognizing that circuit boards have become so crowded that there is no room for known support devices and taking advantage of advancements in test probe tip technology, one preferred embodiment of the present invention is directed to a support device that supports an electrical test probe tip. An assistive fine positioning device for supporting an electrical test probe tip (tip support device) of the present invention is for positioning and/or holding a test probe tip. The tip support device includes at least one positionable support member, a tip adapter at one end of the support member (the first support end) for connecting a test probe tip (e.g. an electrical test probe tip) to the support member, and the opposite end of the support member (the second support end) being attachable to a surface. Preferably the positionable support member is bendable and/or shape retainable. In one embodiment, the positionable support member includes a plurality of support member segments and at least one pivot therebetween. The second support end may be adherable to the surface and/or attachable through the surface.

The present invention is also directed to a head support device for supporting a test probe head. The head support device preferably includes at least one positionable support member, a head adapter at a first support end of the positionable support member, and an attachment system interconnectable with a second support end of the positionable support member. The positionable support member preferably includes a plurality of support member components and at least one point of movement that is defined between tow support member components. The head adapter is used for connecting the support member to the test probe head. The attachment system is for holding and securing to a surface. In one preferred embodiment, the attachment system includes a surface attachment sub-system and a locking sub-system. The surface attachment sub-system and the locking sub-system together secure at least part of the positionable support member therebetween such that movement may be selectively permitted or inhibited.

The present invention is also directed to a locater tool for positioning a support device for supporting a test probe head or a test probe tip. The locater tool includes a template, means for indicating a support device position associated with the template, and means for indicating an achievable probing zone on a surface having connection points when the support device is in the support device position. In a first preferred embodiment the locater tool is a device-attachable locater tool. In this embodiment the means for indicating a support device position is a pair of arms indicating a support device position and the means for indicating an achievable probing zone is an opening or window indicating an achievable probing zone when the support device is in the support device position. In a second preferred embodiment, the locater tool is a pre-positioning locater tool. In this embodiment the means for indicating a support device position may be a cut-out section, an aperture, or a void and the means for indicating an achievable probing zone may be a window, an opening, an opaque cover, guidelines, or tinting.

The present invention also includes methods for using the tip support device, the head support device, and the locater tool.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 8 is a side perspective view of an exemplary fine-positionable tip support device of the present invention attached to a surface and bent to hold a test probe tip in contact with one or more connection points of a vertical surface, the exemplary fine-positionable tip support device having an exemplary positionable support member, an exemplary fine-positionable tip adapter, and an exemplary surface attachment system.

FIG. 9 is a perspective view of an alternative exemplary fine-positionable tip adapter.

DETAILED DESCRIPTION OF THE INVENTION

Figure 1:
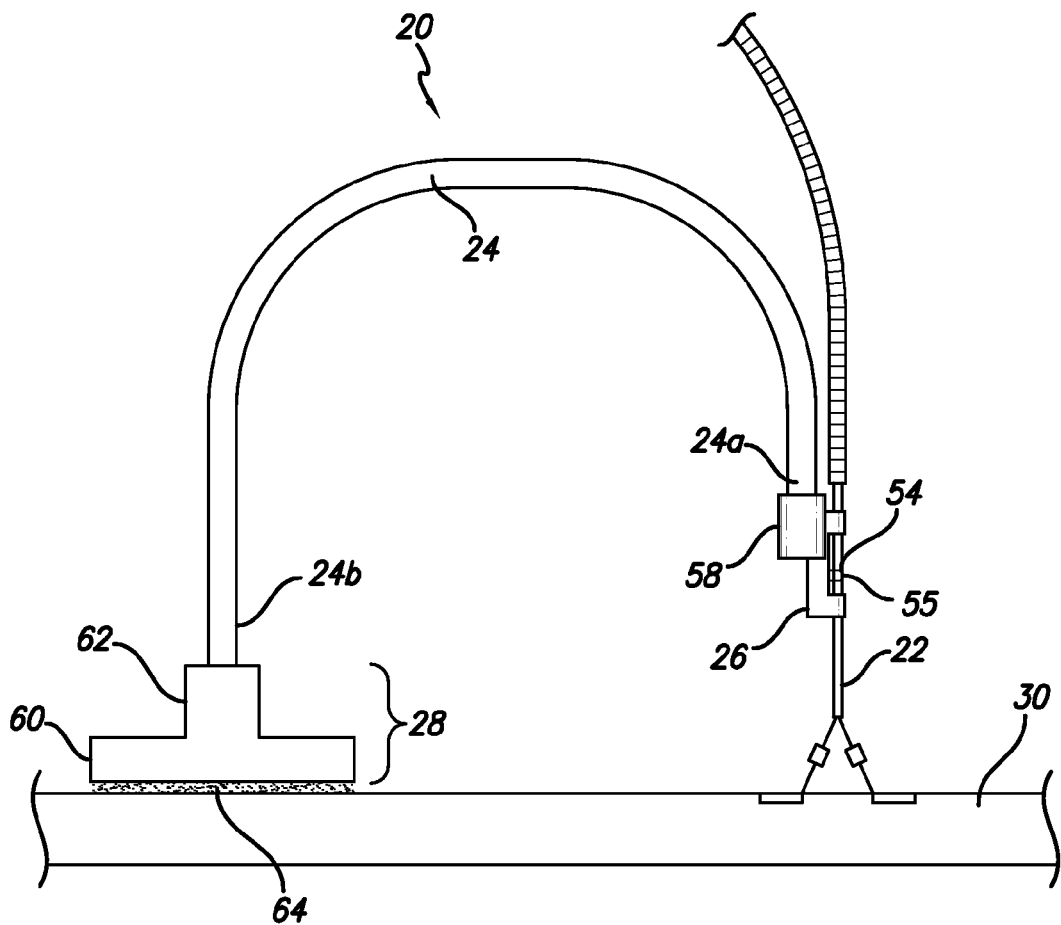
FIG. 1 is a side view of an exemplary tip support device of the present invention attached to a surface and bent to hold a test probe tip in contact with one or more connection points of the surface, the exemplary tip support device having an exemplary positionable support member, an exemplary tip adapter, and an exemplary surface attachment system.
Figure 2:
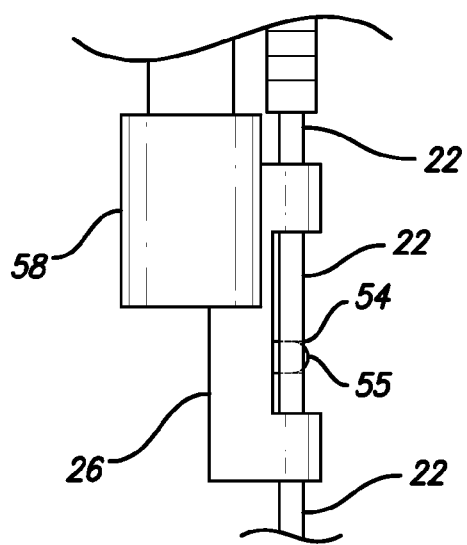
FIG. 2 is an enlarged side view of the exemplary tip adapter.

The present invention relates generally to a support device that allows for hands-free operation of an electrical test probe. The support device may be an assistive fine positioning device (shown in FIGS. 1-12 as tip support device 20 and tip support device 20') for positioning and/or holding a test probe tip 22. Alternatively, the support device may be an assistive fine positioning device (shown in FIGS. 13-16 as head support device 120) for positioning and/or holding a test probe head 122 (that would have a test probe tip 22 that would in contact with one or more connection points of a surface 30). The support devices 20, 20', 120 are preferably include a connection mechanism (e.g. an adhesive mechanism) for attaching the support device to the surface of a circuit board. Finally, the present invention is directed to a locater tool that can be used for positioning support devices 20, 20', 120 on the surface of a circuit board.

I. Tip Support Devices

One preferred embodiment of the present invention is directed to an assistive fine positioning device (discussed generally as tip support device 20) for positioning and/or holding a test probe tip 22. FIGS. 1-12 show exemplary embodiments of the tip support device of the present invention (tip support device 20 and tip support device 20'). The tip support device 20 includes at least one positionable support member (discussed generally as positionable support member 24) having a first support end and a second support end. The first support end includes a tip adapter (discussed generally as tip adapter 26) for connecting a test probe tip 22 to the tip support device 20. The second support end includes an attachment system (discussed generally as attachment system 28) for attaching the tip support device 20 to a surface 30 (e.g. a circuit board).

Figure 10:
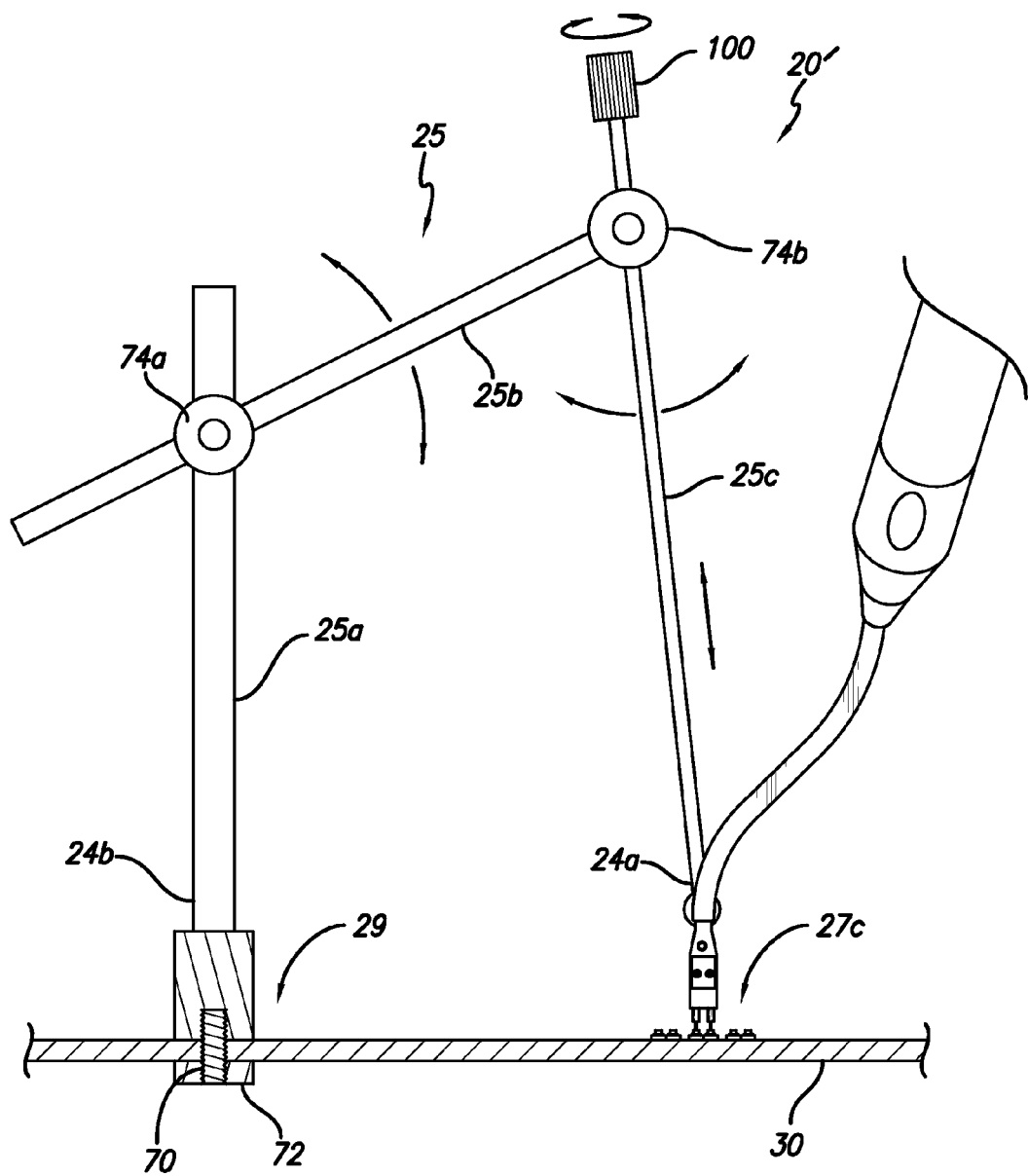
FIG. 10 is a side view of an exemplary through-support tip support device of the present invention attached through a surface and positionable to hold a test probe tip in contact with one or more connection points of the surface, the exemplary through-support tip support device having an alternative exemplary positionable support member, an alternative exemplary fine-positionable tip adapter, and an exemplary through-surface attachment system.

FIGS. 1-9 show a first exemplary tip support device 20 that includes a positionable support member 24 having a first support end 24a and a second support end 24b. A tip adapter 26 (shown in detail in FIGS. 2, 5, and 6) is positioned at the first support end 24a. Alternative tip adapters 27a, 27b, 27c are shown in FIGS. 8-10. The tip adapter 26, 27a, 27b, 27c may be used to connect a test probe tip 22 to the tip support device 20. The second support end 24b includes an attachment system 28 (shown in detail in FIGS. 4 and 7) for attaching the tip support device 20 to a surface 30. This embodiment might be used, for example, during soldering.

Figure 11:
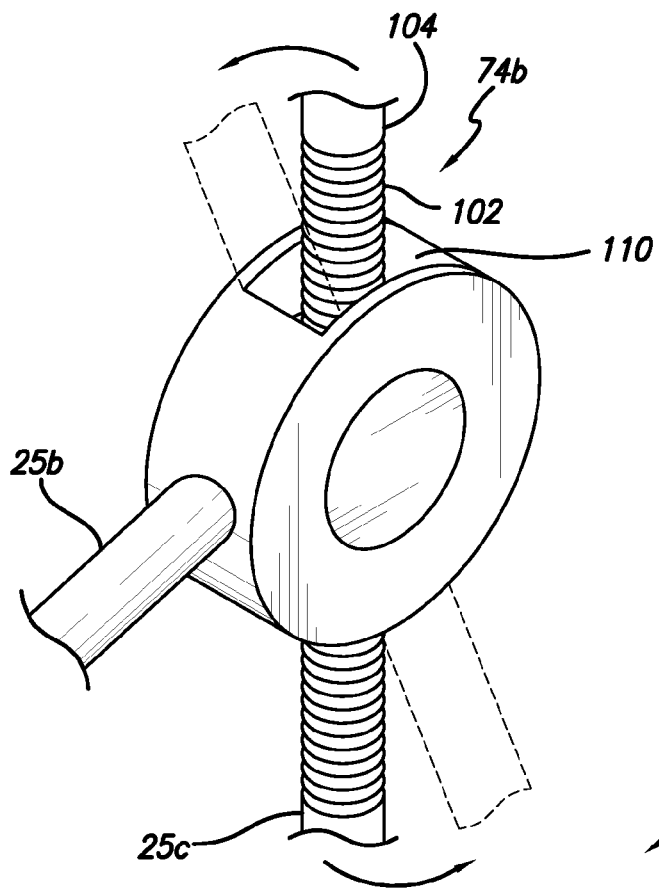
FIG. 11 is a perspective view of a pivot between two support member segments, the pivot including means for raising and lowering the tip adapter.
Figure 12:
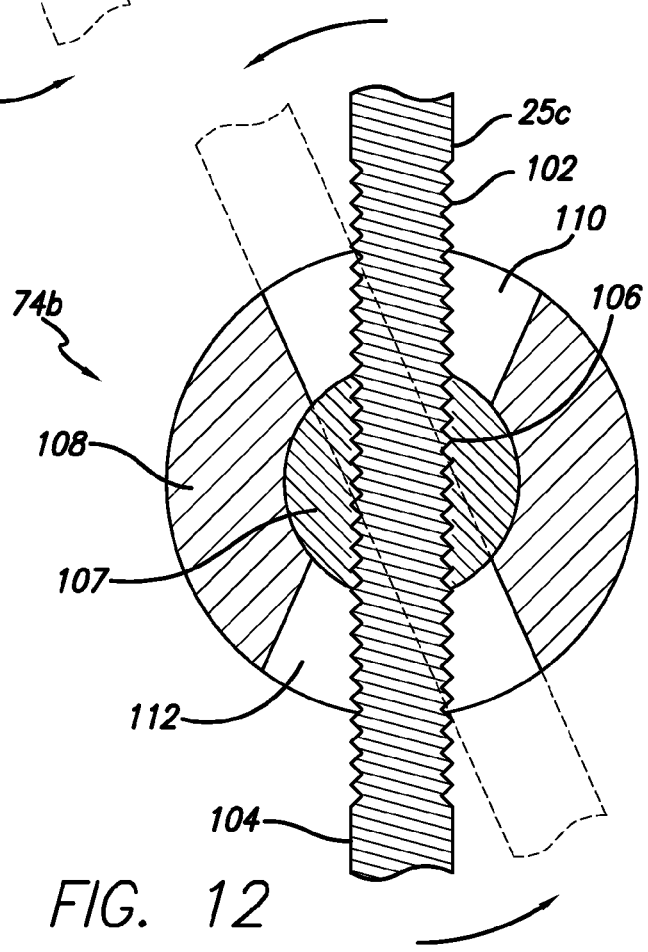
FIG. 12 is a cross-sectional side view of a pivot between two support member segments, the pivot including means for raising and lowering the tip adapter.
Figure 13:
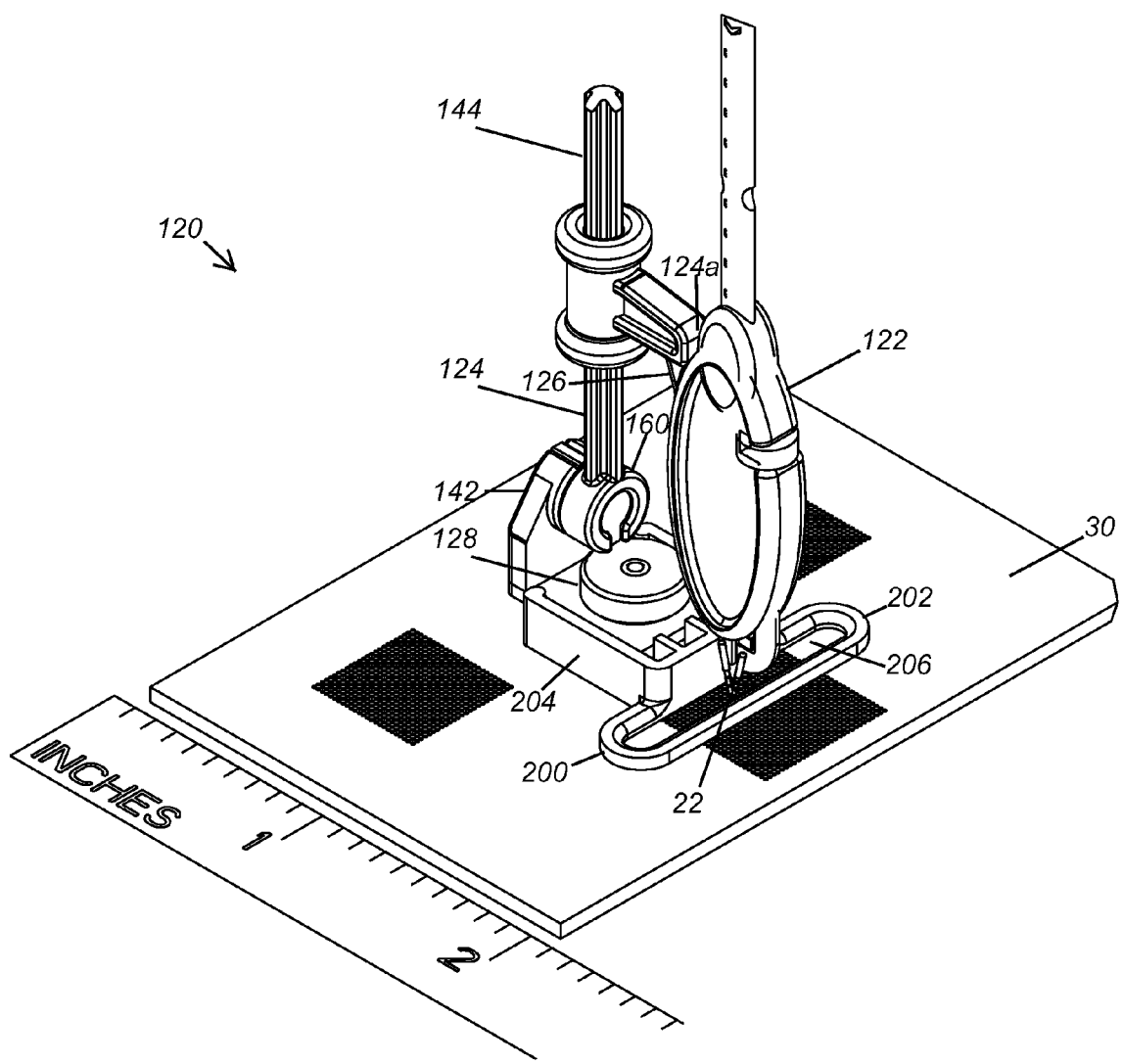
FIG. 13 is a perspective view of an exemplary head support device of the present invention including a positionable support member, a head adapter, and an attachment system, the head support device supporting a test probe head, attached to a surface and using a first preferred embodiment of a locater tool.
Figure 14:
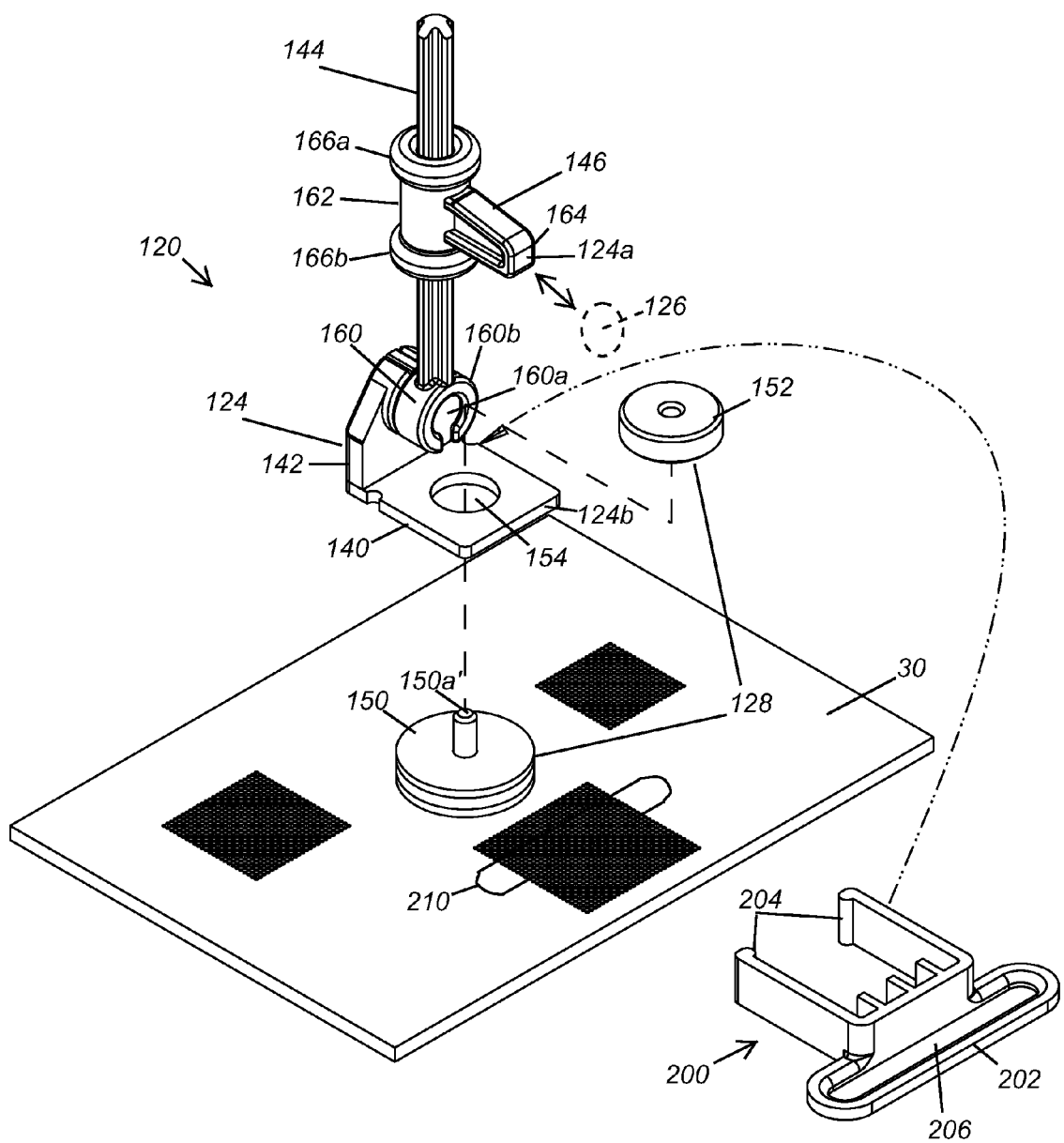
FIG. 14 is an exploded view of an exemplary head support device of the present invention including a positionable support member, a head adapter, and an attachment system, and the relationship with the first preferred embodiment of a locater tool.

FIGS. 10-12 show a second exemplary alternative tip support device 20'. The alternative tip support device 20' includes an alternative positionable support member 25. The alternative positionable support member 25 includes a plurality of support member segments 25a, 25b, and 25c. Preferably, the first support end 24a is at one end of one of the support member segments and the second support end 24b is at the distal end of another of the support member segments. Any of the alternative tip adapters 26, 27a, 27b, 27c could be used with this embodiment. The shown alternative attachment system 29 is a through-surface attachment system 29. The tip support device 20' would be particularly useful when a probe tip 22 has relative motion (e.g. a pogo). One reason for this is because the tip support device 20' uses the through-surface attachment system 29 that is very secure. Another reason for this is because the tip support device 20' will not flex backward (to relieve the pressure of the pogo) once positioned. Yet another reason for this is because the tip support device 20' allows for micro-adjustments between the extended and contracted positions of the pogo.

The present invention recognizes that circuit boards have become so crowded that there is no room for known off-board and medium proximity tip support devices. Taking advantage of advancements in test probe tip technology, preferred embodiments of the present invention support the electrical test probe tip 22 itself, not the entire probing head. One such advance in test probe tip technology is described in U.S. Pat. No. 6,822,463 and U.S. patent application Ser. No. 10/995,801 (now U.S. Pat. No. 7,019,544), the disclosures of which are incorporated herein by reference. These exemplary advanced test probe tip technologies have a very small point of contact (e.g. test probe tip 22) because the differential amplifier is distanced from the point of contact.

Using the tip support device 20, a single user can monitor multiple channels. Using the tip support device 20, a single user can monitor a single channel and simultaneously make adjustments to an oscilloscope. Using the tip support device 20, a single user can place the test probe tip and solder it in place and/or provide solder in reinforcement. Using the tip support device 20, a connection would not be lost if the circuit board is moved.

Figure 6:
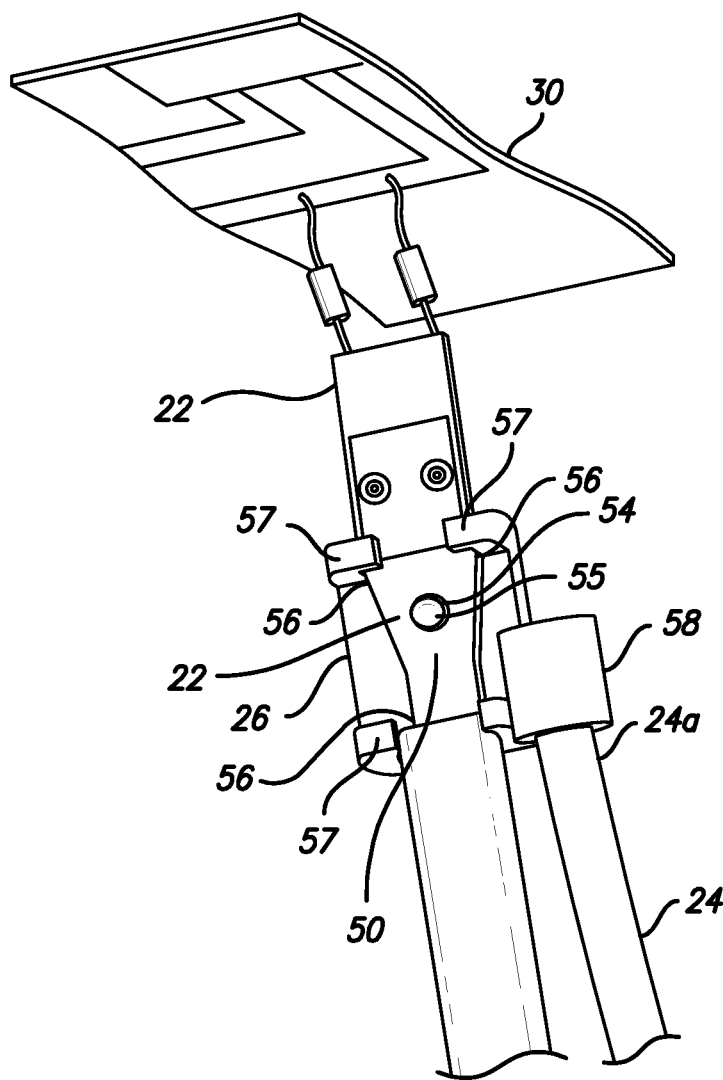
FIG. 6 is a perspective view of a test probe tip positioned within the exemplary tip adapter, with the test probe tip being in contact with one or more connection points of an upside-down surface.

Preferred embodiments of the tip support device 20 work on modern crowded circuit boards where there is little room for tip support devices. Preferred embodiments of the tip support device 20 can also work in cages or where several circuit boards are placed in close proximity (tight spacing) to each other. Defying gravity, preferred embodiments of the tip support device 20 can work on vertical surfaces 30 (FIG. 9) or upside-down surfaces 30 (FIG. 6).

One of the reasons for the versatility of the tip support device 20 is the small size of the positionable support member 24, tip adapter 26, and/or attachment system 28. Another reason for the versatility of the tip support device 20 is the extreme adjustability of the positionable support member 24 in that preferred embodiments can be bent in any direction and to minute desired positions. Yet another reason for the versatility of preferred embodiments of the tip support device 20 is the use of a tip adapter 26 that attaches to the test probe tip 22. Still another reason for the versatility of preferred embodiments of the tip support device 20 is the use of an attachment system 28, 29 that attaches directly to and/or through the surface 30.

The following sections provide detail and exemplary embodiments of the positionable support member, tip adapter, and surface attachable second support end.

A. Positionable Support Member

Figure 3:
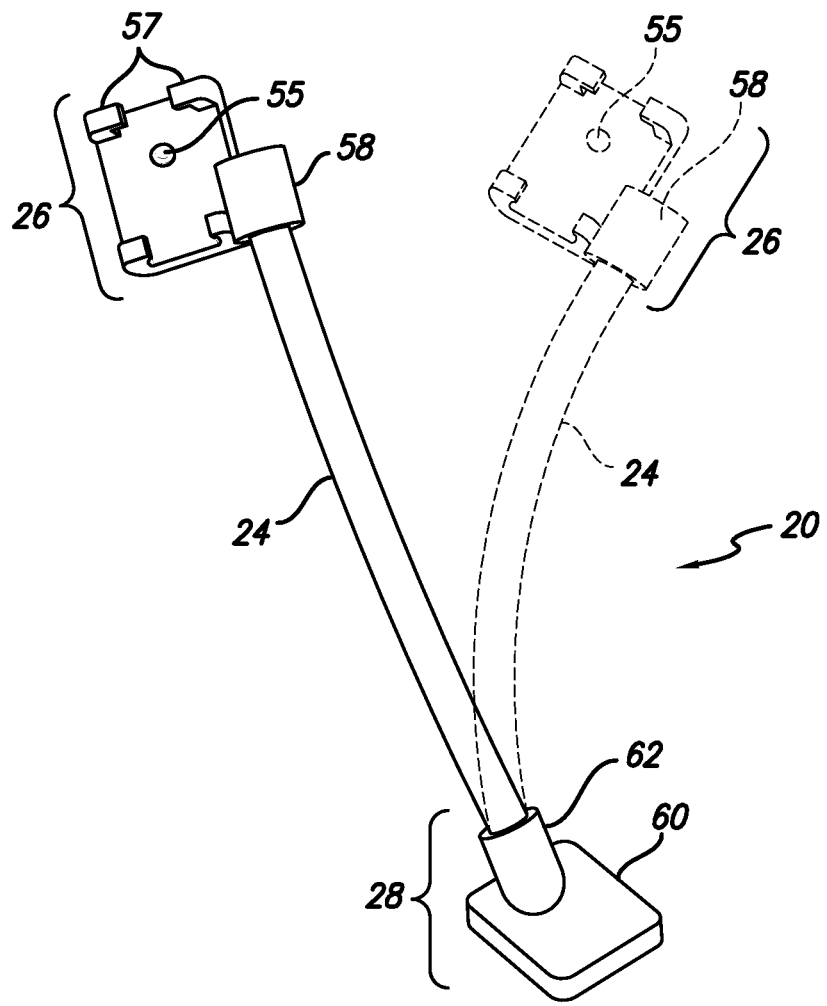
FIG. 3 is a perspective view of the exemplary tip support device of the present invention showing bending motion.

The positionable support member 24 is preferably bendable as shown in FIGS. 1 and 3. The term "bendable" is used to describe a characteristic that is between "floppy" and "stiff." In preferred embodiments, the bending is preferably accomplished by hand. As the tip support device 20 is relatively small, the bending will usually be done with a user's fingertips. Preferably, the positionable support member 24 can be bent in any direction and at substantially any point along its length. This allows for the most options in positioning the positionable support member 24.

The positionable support member 24 is also preferably shape retainable. The term "shape retainable" is used to describe the characteristic that once the positionable support member 24 has been bent into a desired shape, the positionable support member 24 maintains that shape until it is bent again. Shape retainable can be contrasted to a spring which, after being bent, would return to its original shape when released. Shape retainable can also be contrasted to floppy and stiff. If the positionable support member 24 were floppy, it would not maintain its shape. If the positionable support member 24 were stiff, it could not be bent (or bent again) without significant effort or tools. A preferred positionable support member 24 would be shape retainable such that once the positionable support member 24 is bent into a desired shape, the tip support device 20 can be positioned and even repositioned while the positionable support member 24 retains its shape. In other words, the tip support device 20 can be attached (e.g. attached to a surface 30), removed (e.g. lifted from a surface 30), and/or replaced while the positionable support member 24 retains its shape. Further, a test probe tip 22 can be attached (e.g. inserted into), removed, or replaced from the tip adapter 26 while the positionable support member 24 retains its shape.

Figure 4:
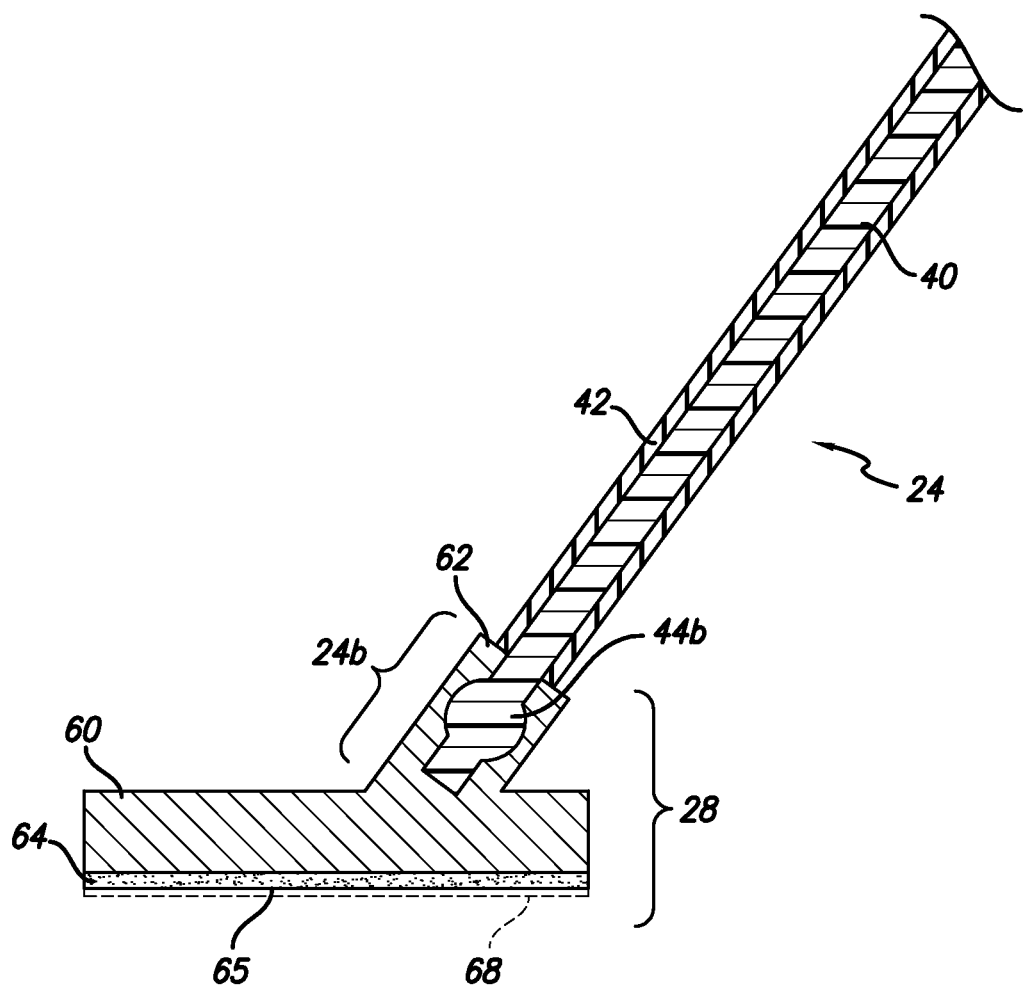
FIG. 4 is a cross-sectional side view of the exemplary positionable support member and the exemplary surface attachment system.

As shown in FIG. 4, the positionable support member 24 preferably has a central bendable member 40 made from, for example, a semiflex coax. Semiflex coax has the appropriate bendability and shape retainability as discussed. Other advantages of semiflex coax include that it is extremely durable, easy to obtain, relatively inexpensive, and reliable. Alternatively, the central bendable member 40 may be made from wire.

Substantially the entire length of the central bendable member 40 may be coated or covered with an outer protectant 42. In preferred embodiments, the outer protectant 42 would be electrically non-conductive and would allow bending of the central bendable member 40. For example, the central bendable member 40 may have a braided jacket outer protectant 42. Alternatively, the central bendable member 40 may be coated in an outer protectant 42 such as a plastic or rubber coating. One advantage of having an electrically non-conductive outer protectant 42 surrounding the central bendable member 40 is that the electrically non-conductive outer protectant 42 prevents undesired electronic interactions.

In one preferred embodiment, the first support end 24a and the second support end 24b of the positionable support member 24 are substantially free from the outer protectant 42. This could be accomplished using a stripping process similar to wire stripping.

Figure 5:
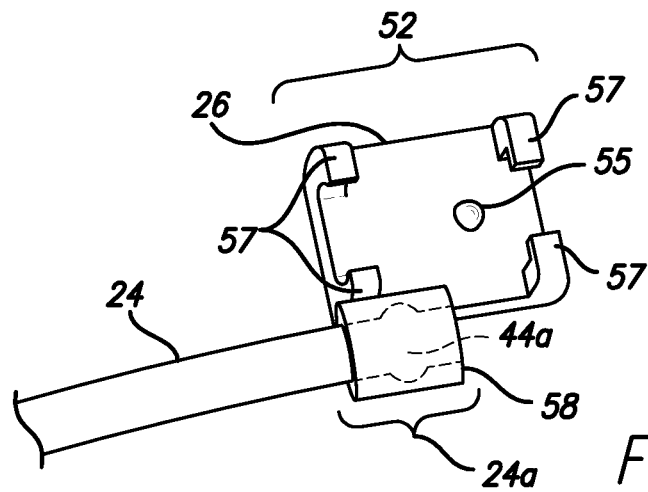
FIG. 5 is a perspective view of the exemplary tip adapter.

In one preferred embodiment, the first support end 24a and the second support end 24b are at least slightly deformed 44a, 44b as shown in FIGS. 4-5. This could be accomplished using a crimping process to flatten at least part of the support ends 24a, 24b. One reason for deforming the support ends 24a, 24b is to prevent rotation between the support ends 24a, 24b and the associated tip adapter 26 or attachment system 28.

FIG. 10 shows an alternative tip support device 20' having an alternative exemplary positionable support member 25. This embodiment uses a segmented support member 25 shown with three support member segments 25a, 25b, and 25c. It should be noted that more or less segments 25a, 25b, 25c could be used in this embodiment.

Pivots 74a, 74b (discussed generally as pivots 74) between the segments 25a, 25b, 25c allow movement therebetween. The pivots 74 are relatively stiff such that the support member 25 is shape retainable. In the embodiments shown in FIGS. 11-12, two types of motion are allowed: vertical (e.g. up and down) and swinging (e.g. back and forth). Vertical motion is accomplished by actuating (e.g. by twisting or rotating) the top end 100 of the segment 25c so that threads 102 at least partially along the segment's length 104 move in relation to inner threads 106 of the pivot 74b. Rotating the segment 25c in a first direction raises the segment 25c (and thereby the tip adapter 27c). Rotating the segment 25c in a second direction lowers the segment 25c (and thereby the tip adapter 27c). Vertical motion could also be accomplished by levers, dials, ratchets, or other mechanisms that allow controlled raising and lowering. Swinging motion is accomplished by moving one end of segment 25c. In the shown embodiment, an inner pivot member 107 moves in relation to an outer pivot member 108. Openings 110, 112 at the top and bottom of the outer pivot member 108 allow the segment 25c to move therein. Larger openings 110, 112 allow for a greater range of motion. Although shown as disc shape in FIG. 11, the inner and outer pivot members 107, 108 could be spherical and the openings 110, 112 could be circular (or conical) such that there is a broader range of the swinging motion. FIG. 12 could be a cross-section of either the disc shape embodiment or the spherical embodiment.

It should be noted that the shown pivots 74 are meant to be exemplary and not to limit the scope of the invention. It should be noted that the pivots 74 may be any type of device that allows for movement between the segments 25a, 25b, 25c. For example, the pivots 74 may be simple screws, ball and joint sockets, or lengths of bendable material (e.g. coax). Further, additional pivots 74 may be added. For example, an additional pivot 74 between the through-surface attachment system 29 and the attached positionable support member 25 would allow rotation therebetween. Shown exemplary pivot 74a (or other pivots 74) could include structure similar to shown exemplary pivot 74b so that micro-adjustments could be made in other directions.

It should be noted that the alternative tip support device 20' shown in FIGS. 10-12 is bendable at least at the pivots 74. In an alternative embodiment, one or more of the support member segments 25a, 25b, and 25c may be made of a material that is bendable and shape retainable.

Although the shown embodiments show only a single positionable support member 24, it is possible that alternative embodiments could have a plurality of positionable support members. This would allow a single attachment system 28 to have a plurality of attached positionable support members, each positionable support member having at least one tip adapter 26. Such a configuration would be helpful in situations where multiple tips are needed in close proximity to each other.

In one exemplary method of using the present invention, the user bends the positionable support member 24 into a desired shape. The bending is preferably accomplished by the user's fingers. It should be noted that the user may bend or re-bend the positionable support member 24 after the tip support device 20 is attached to the surface 30.

B. Tip Adapter

In one preferred embodiment, the test probe tip 22 and the tip adapter 26 are designed to work together such that the test probe tip 22 is relatively easily inserted into the tip adapter 26, is relatively securable within the tip adapter 26, and is relatively easily removed from the tip adapter 26. The tip adapter 26 accomplishes these objectives without damaging the test probe tip 22. In this embodiment, the test probe tip 22 includes a first part 50 of a two-part connection mechanism and the tip adapter 26 includes a second part 52 of the two-part connection mechanism. The first part 50 of the two-part connection mechanism is interconnectable with the second part 52 of the two-part connection mechanism.

In the exemplary embodiment shown in FIGS. 1, 2, 5, and 6, the first part 50 of the two-part connection mechanism may include a connection void 54 defined in the test probe tip 22 and the second part 52 of the two-part connection mechanism may include a connection protrusion 55 in the tip adapter 26. The connection protrusion 55 in this embodiment is suitable for mating with the connection void 54.

As best shown in FIG. 6, the first part 50 of the two-part connection mechanism may, in addition or in the alternative, include connection edges 56 along the outer periphery of the test probe tip 22 and the second part 52 of the two-part connection mechanism may, in addition or in the alternative, include at least one connection grip 57 in the tip adapter 26. The at least one connection grip 57 in this embodiment is suitable for mating with the connection edges 56. Each connection grip 57 is shown as a pair of gripping fingers that grip corresponding connection edges 56 of the test probe tip 22.

In use, one method by which the test probe tip 22 may be connected to the tip adapter 26 is by gently sliding the test probe tip 22 through the connection grip(s) 57 at an angle so that the center part of the test probe tip 22 is higher than the connection protrusion 55. Then, when the connection void 54 is substantially in alignment with the connection protrusion 55, the test probe tip 22 is lowered until the connection protrusion 55 mates with the connection void 54.

One advantage of the shown two-part connection mechanisms ((a) the connection protrusion 55 to the connection void 54 embodiment and (b) the connection grip 57 to the connection edges 56 embodiment) is how gentle they are to the test probe tip 22. For example, because they are passive connectors (as opposed to clamping connectors), they do not add pressure to sensitive components. The shown two-part connection mechanisms are also designed so that they do not scratch, crack, chip, or otherwise damage the test probe tip 22. As compared to devices that secure a probing head, this gentle factor is extremely important.

Other advantages to the shown two-part connection mechanisms are that they are relatively simple to manufacture, they are relatively inexpensive, they are of a one-piece construction (e.g. the tip adapter 26 is one piece), they require no moving parts, and they are relatively easy to manipulate (despite the extremely small size).

Exemplary alternative connection mechanisms that may be used alone or in conjunction with the above identified two-part connection mechanisms include, but are not limited to, adhesive and a surface, hooks and eyes, hook and loop material, and gentle clamps. It is also possible that the connection void/connection protrusion can be used without the connection edges/connection grip. Further, it is possible that the connection edges/connection grip can be used without the connection void/connection protrusion. Still further, it is possible that alternative connection mechanisms may be used with either the connection void/connection protrusion or the connection edges/connection grip.

The tip adapter 26 also includes a first support end connector 58 for connecting the first support end 24a to the tip adapter 26. In the shown embodiment, the first support end connector 58 includes a simple bore into which the first support end 24a can be inserted and secured. The first support end 24a can be secured within the simple bore using connection means such as adhesive (e.g. glue), a pressure fit, or mechanical means.

FIGS. 8, 9, and 10 show exemplary embodiments of fine-positionable tip adapters. These embodiments recognize that positionable support members may be difficult to shape and/or position exactly. For example, in some embodiments a positionable support member must be bent past its desired position and then adjusted back (e.g. sprung) to its desired position. However, if a tip support device 20 is pre-positioned prior to being shaped, then it may not be possible to bend the positionable support member into an exact shape. Other times a change in probe tips necessitates a micro-adjustment. Fine-positionable tip adapters allow for micro-adjustments and thus are micro-positionable. In the exemplary embodiment shown in FIG. 8, inserting and twisting the screw 80 allows the tip adapter 27a to slide up and down on rails 82. In the exemplary embodiment shown in FIG. 9, twisting the screw 90 allows the tip adapter 27b to rise up and lower down on the screw length 92 between the opposite ends of the C-clamp 94. In the exemplary embodiment shown in FIGS. 10-12, the segment 25c may be twisted and/or raised or lowered to allow micro-adjustments of the tip adapter 27c. In this shown embodiment, the segment can be rotated at its top end 100 such that threads 102 at least partially move along the segment's length 104 in relation to inner threads 106 of the pivot 74b. These alternative tip adapters 27a, 27b, 27c may be used in place of the tip adapter 26. In addition, compressive force can be increased for pressure contact style tips.

In one preferred embodiment, the tip adapter 26 includes an interchangeable first support end connector such that the tip adapter 26 may be removed from the positionable support member 24. One exemplary interchangeable first support end connector could be a threaded bore into which the first support end 24a could be screwed. Another exemplary interchangeable system could use a pressure fitting connection between the bore and the first support end 24a. One advantage to an interchangeable first support end connector is that by replacing the tip adapter 26, alternative test probe tips can be supported.

C. Surface Attachable Second Support End

The second support end 24b is attachable to a surface 30. In the shown embodiments, an attachment system 28 is used for attaching the second support end 24b to the surface 30. It should be noted that the attachment system 28 may include a plurality of components to carry out its function including a platform 60, a second support end connector 62, and a connection mechanism 64.

For purposes of this disclosure, the term "attachable" is meant to describe any means by which the second support end 24b may be held and secured to the surface 30. In some preferred embodiments, "attachable" refers to permanent (e.g. nonremovable) attachment. In other preferred embodiments, "attachable" refers to a nonpermanent (e.g. removable) attachment. In other words, it is within the scope of the invention that the second support end 24b may be attached in a permanent or nonpermanent manner.

The platform 60 is preferably a substantially flat piece. As the purpose of the present invention is for use in relatively crowded situations, the platform 60 should be relatively small. The platform 60 may be stiff or it may be at least partially malleable to allow for deviations on or in the surface 30 upon which it will rest. The platform 60 should be electrically inert.

The second support end connector 62 functions as an intermediary between the second support end 24b and the platform 60. The second support end connector 62 has means for connecting the second support end 24b to the attachment system 28. In the shown embodiment, the second support end connector 62 includes a simple bore into which the second support end 24b can be inserted and secured. The second support end 24b can be secured within the simple bore using connection means such as adhesive (e.g. glue), a pressure fit, or mechanical means.

In one preferred embodiment, the attachment system 28 includes an interchangeable second support end connector 62 such that the attachment system 28 may be separated from the positionable support member 24. One exemplary interchangeable second support end connector 62 could be a threaded bore into which the second support end 24b could be screwed. Another exemplary interchangeable system could use a pressure fitting connection between the bore and the second support end 24b. One advantage to this is that the attachment system 28 may be left in a correct position for reuse. Another advantage to this is that if removal of the attachment system 28 would cause damage, it could be left on the surface 30.

The connection mechanism 64 may be, for example, an adhesive mechanism for attaching the second support end 24b (via the attachment system 28) to the surface 30.

An adhesive mechanism may be, for example, permanent or non-permanent (e.g. removable) adhesive. In preferred embodiments, the nonpermanent adhesives do not leave any residue when they are removed.

As shown in FIG. 4, the connection mechanism 64 may be a direct adhesive 65 that is applied, coated, or integrated directly on the bottom surface of the platform 60. It should be noted that the direct adhesive 65 may be permanent or non-permanent adhesive. In preferred embodiments, a removable protective sheet 68 covers the direct adhesive 65 so that the adhesive 65 is not spoiled as it is transported and stored.

Figure 7:
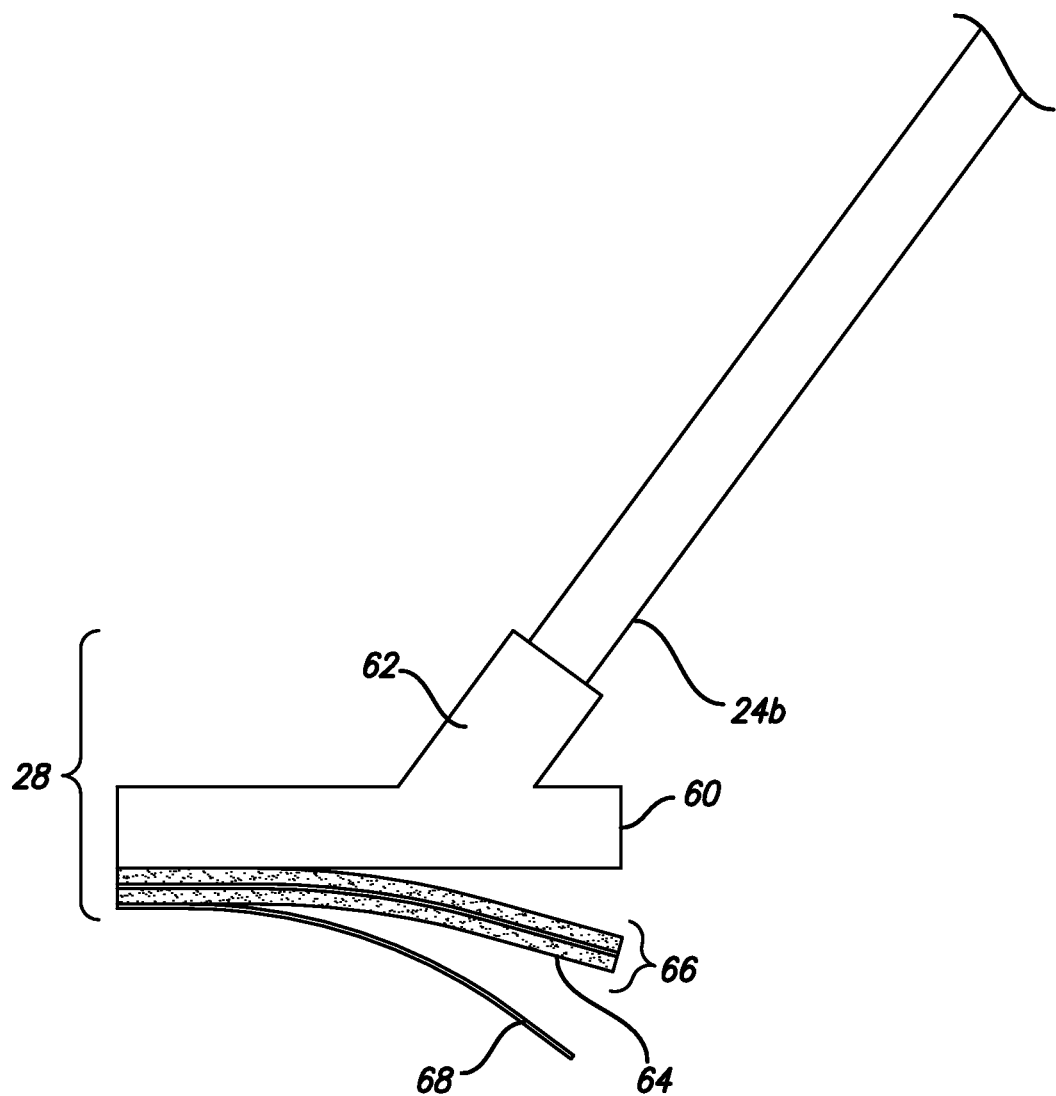
FIG. 7 is a side view of an exemplary surface attachment system with an alternative connection mechanism shown as a double coated tape.

As shown in FIG. 7, the connection mechanism 64 may be an indirect adhesive 66 that is attached indirectly on the bottom surface of the platform 60. Exemplary indirect adhesives 66 include, but are not limited to, double coated (e.g. two-sided) papers and/or tapes. It should be noted that the indirect adhesive 66 may be permanent, non-permanent adhesive, or a combination thereof. For example, double coated papers and/or tapes may have permanent adhesive on both sides of a central carrier, non-permanent adhesive on both sides of a central carrier, or permanent adhesive on one side and non-permanent adhesive on the other side of a central carrier. In preferred embodiments, a removable protective sheet 68 covers both sides of the indirect adhesive 66 so that the adhesive 66 is not spoiled as it is transported and stored. In some embodiments of the preferred embodiments, a strip of indirect adhesive 66 (or a plurality of indirect adhesive 66 units) is included with each tip support device 20. The user then removes a protective sheet 68 from one side of the indirect adhesive 66 and attaches the exposed side to the bottom surface of the platform 60 (as shown in FIG. 7). Then, the user can remove the second protective sheet 68 when the tip support device 20 is ready to be positioned on the surface 30.

Alternative connection mechanisms 64 include, but are not limited to, a suction cup, hook and loop fabrics, and mechanical means.

One exemplary alternative attachment system is shown in FIG. 10. This attachment system is a through-surface attachment system 29. An exemplary embodiment of a through-surface attachment system 29 would include a screw and/or pin system 70 that extends through the surface 30 and a retainer 72 that secures the pin system 70 in place. This embodiment takes advantage of holes in the surface 30. Alternatively, a user could bore holes in the surface. Still alternatively, the through-surface attachment system 29 could be self boring.

It should be noted that embodiments having a plurality of positionable support members 24 could include a single second support end connector 62 able to accommodate multiple positionable support members 24. It should be noted that embodiments having a plurality of positionable support members 24 could include a plurality of second support end connectors 62 attached to a single platform 60, each second support end connector 62 being able to accommodate a single positionable support member 24.

In one exemplary method of using the present invention, the tip support device 20 is prepared by attaching an indirect adhesive 66 mechanism to the bottom surface of the platform 60. To do this, the user removes a protective sheet 68 from one side of the indirect adhesive 66 and attaches the exposed side to the bottom surface of the platform 60 (as shown in FIG. 7). Then, the user can remove the second protective sheet 68 when the tip support device 20 is ready to be positioned on the surface 30. It should be noted that embodiments such as those shown in FIG. 4 having direct adhesive 65 would not need to be prepared.

In one exemplary method of using the present invention, a removable protective sheet 68 is removed from the connection mechanism 64. It should be noted that in alternative embodiments no removable protective sheet 68 may be needed.

In one exemplary method of using the present invention, the tip support device 20 can be attached to a surface 30. If the connection mechanism 64 is a removable connection mechanism 64, the tip support device 20 can be lifted from the surface and repositioned as needed for proper placement. During the process of placement, the positionable support member 24 preferably retains its desired shape.

D. Miscellaneous

In one exemplary method of using the present invention, the user may further bend the positionable support member 24 into a more accurate shape after placement on the surface 30.

In one exemplary method of using the present invention, a test probe tip 22 can be attached to (e.g. inserted into) the tip adapter 26. The user may further bend the positionable support member 24 so that the test probe tip 22 makes contact with the connection point(s).

In one exemplary method of using the present invention, once the test probe tip 22 makes contact with the connection point(s) or the tip support device 20 is otherwise in its desired shape and/or position, the user can monitor multiple channels, monitor a single channel and simultaneously make adjustments to an oscilloscope, and place the test probe tip and solder it in place. The user may also remove and/or replace the test probe tip 22 from the tip adapter 26.

In embodiments of the present invention in which the connection mechanism 64 is removable, the tip support device 20 may be removed (e.g. lifted from a surface 30) and/or replaced while the positionable support member 24 retains its shape.

II. Head Support Devices

Another preferred embodiment of the present invention is directed to an assistive fine positioning device (discussed generally as head support device 120) for positioning and/or holding a test probe head 122. FIGS. 13-16 show an exemplary embodiment of the head support device 120. The head support device 120 includes at least one positionable support member (discussed generally as positionable support member 124), a head adapter (discussed generally as head adapter 126 and shown in phantom), and an attachment system (discussed generally as attachment system 128). The head adapter 126 is used to connect a test probe head 122 to the head support device 120. The attachment system 128 is used to attach the head support device 120 to a surface 30 (e.g. a circuit board). The positionable support member has a first support end 124a and a second support end 124b. The positionable support member 124 includes a plurality of support member components (e.g. a base component 140, a hinge support component 142, a slide component 144, and an extension component 146). The extension component 146 preferably includes the first support end 124a that supports the head adapter 126. The base component 140 at the second support end 124b includes structure for interacting with the attachment system 128 for attaching the head support device 120 to a surface 30.

One significant advantage of the head support device 120 of the present invention is the use of an attachment system 128 that is distinct from the positionable support member 124 and that is permanently or semi-permanently attachable to a surface. This would allow users or manufacturers to place one or more attachment system 128 in key locations. The user could then add the positionable support member 124 and head adapter 126 easily and efficiently.

Another significant advantage of the head support device 120 of the present invention is its multiple points of movement. In the shown embodiment, there is movement between the attachment system 128 and the base component 140. In the shown embodiment, there is movement between the hinge support component 142 and the slide component 144. In the shown embodiment, there is movement between the slide component 144 and the extension component 146. In alternative embodiments there may be movement between the extension component 146 and the head adapter 126 and/or between the head adapter 126 and the test probe head 122. In alternative embodiments some of the components may include additional "joints" to allow additional movement (e.g. the extension component 146 and/or the head adapter 126 may include additional joints that allow the test probe head 122 to pivot, for example, to either side or completely upside-down). This would allow users an infinite variety of movements or combination of movements for probing with the test probe head 122.

As with the previously discussed tip support devices 20, 20', using the head support device 120, a single user can monitor multiple channels, monitor a single channel and simultaneously make adjustments to an oscilloscope, place a test probe tip and solder it in place and/or provide solder in reinforcement, and/or prevent a connection from being lost if the circuit board is moved.

Unlike the previously discussed tip support devices 20, 20' that support only a test probe tip 22, the head support device 120 supports a test probe head 122. The head support device 120 is made of the appropriate materials (e.g. having the appropriate size, shape, and weight bearing capacity) to support a test probe head 122. It should be noted, however, that a head support device 120 could be made of a size, shape, and weight bearing capacity such that it can support only a test probe tip 22.

The following sections provide detail and exemplary embodiments of the positionable support member 124, head adapter 126, and attachment system 128.

A. Attachment System 128

An exemplary attachment system 128 of the present invention includes a surface attachment sub-system 150 (shown in detail in FIG. 17) and a locking sub-system 152. Together, these sub-systems 150, 152 form an attachment system 128 used to attach the head support device 120 to a surface 30 (e.g. a circuit board). In the shown preferred embodiment, these sub-systems 150, 152 are attachable and detachable from each other. Further, these sub-systems 150, 152 can be loosened without complete detachment to increase the space therebetween.

Figure 17:
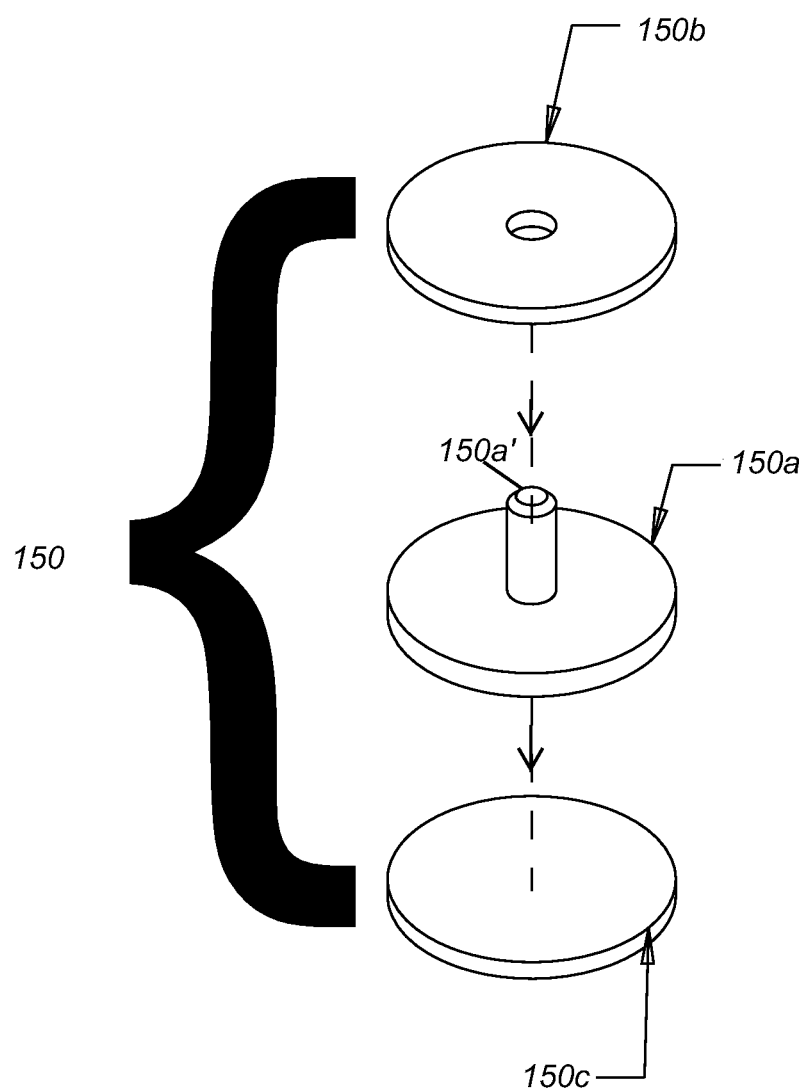
FIG. 17 is an exploded view of an exemplary surface attachment sub-system including a stud part, a rubber support pad part, and a connection part.

FIG. 17 is an exploded view of an exemplary surface attachment sub-system 150 of an exemplary attachment system 128. The surface attachment sub-system 150 is constructed from three parts: a stud part 150a, a rubber support pad part 150b, and a connection part 150c. In the shown embodiment, the stud part 150a is disk with an upwardly projecting cylindrical member 150a'. In the shown embodiment, the rubber support pad part 150b is an O-shaped (round with a hole through the center through which the upwardly projecting cylinder 150a' of the stud part 150a projects) disk of rubber with, for example, adhesive on the side (shown as the lower side) that is to mate with the stud part 150a. In the shown embodiment, the connection part 150c is a disk of two-sided adhesive on the upper and lower sides that mates with the bottom surface of the stud part 150a. The connection part 150c may be similar to indirect adhesive 66 (discussed above). Further, alternative adhesive mechanisms may be, for example, permanent or non-permanent (e.g. removable) adhesive (although in preferred embodiments, the nonpermanent adhesives do not leave any residue when they are removed) and/or the adhesive mechanisms may be, for example, applied, coated, or integrated directly on the bottom surface of the stud part 150a. In preferred embodiments, a removable protective sheet covers the adhesive so that the adhesive is not spoiled as it is transported and stored. Still further, alternative connection mechanisms 64 include, but are not limited to a suction cup, hook and loop fabrics, and mechanical means. It should further be noted that alternative embodiments of the surface attachment sub-system 150 may be made from more or fewer component parts.

The surface attachment sub-system 150 of the attachment system 128 is permanently or semi-permanently attachable to a surface 30. As mentioned, this would allow users or manufacturers to place at least one surface attachment sub-system 150 of the attachment system 128 in key locations. The user could then add the positionable support member 124 and head adapter 126 easily and efficiently and then secure using the locking sub-system 152. Further, as shown in the figures, preferably there is movement between the attachment system 128 and the base component 140 of the positionable support member 124. This will be discussed in more detail below in connection with FIGS. 18A-18C and FIGS. 19A-19D.

For purposes of this disclosure, the term "attachable" is meant to describe any means by which the surface attachment sub-system 150 may be held and secured to the surface 30. In some preferred embodiments, "attachable" refers to permanent (e.g. nonremovable) attachment. In other preferred embodiments, "attachable" refers to a nonpermanent (e.g. removable) attachment. In other words, it is within the scope of the invention that the surface attachment sub-system 150 may be attached in a permanent or nonpermanent manner.

The locking sub-system 152, as shown, may be a thumb screw. It should be noted, however, that any locking sub-system 152 that would interconnect (attach, detach, and loosen) with the surface attachment sub-system 150 such that there was a space therebetween would function with the present invention.

It should be noted that a multiple surface attachment sub-systems 150 could be provided with each head support device 120 or the surface attachment sub-systems 150 can be purchased individually. A user could position multiple surface attachment sub-systems 150 in key locations. The user could then attach the head support device 120 at the key location whenever it was actually needed.

B. Head Adapter 126

In one preferred embodiment, the test probe head 122 and the head adapter 126 (shown in phantom) are designed to work together such that the test probe head 122 is relatively easily inserted into the head adapter 126, is relatively securable within the head adapter 126, and is relatively easily removed from the head adapter 126. The head adapter 126 accomplishes these objectives without damaging the test probe head 122. The head adapter 126 is shown in phantom because of the number of variations there could be without affecting the scope of the invention. For example, in one preferred embodiment, the head adapter 126 could include a first part (e.g. a "hook") of a two-part connection mechanism and the test probe head 122 could include a second part (e.g. a "notch") of the two-part connection mechanism. The first part of the two-part connection mechanism is interconnectable with the second part of the two-part connection mechanism.

It should be noted that the head adapter 126 described herein is meant to be exemplary and not to limit the scope of the invention.

Alternative head adapters 126 are described in U.S. Pat. No. 6,462,529, which is assigned to the same assignee as the present application, and which is hereby incorporated by reference. Head adapter 126 of the present invention, therefore, may be replaced with the adapters described in U.S. Pat. No. 6,462,529 including, but not limited to the described interchangeable connector, the integral connector, the adaptable connector, and the attachment connector. It should be noted that the head adapter 126 would attach to the positionable support member 124 (and most likely the extension component 146) rather than the "legs" described in U.S. Pat. No. 6,462,529.

Additional alternative head adapters 126 could be similar to the two-part connection mechanism used between the test probe tip 22 and the tip adapter 26 as well as the alternatives discussed therefore.

C. Positionable Support Member 124

The positionable support member 124 includes a plurality of support member components (e.g. a base component 140, a hinge support component 142, a slide component 144, and an extension component 146). The extension component 146 preferably includes the first support end 124a that supports the head adapter 126. The base component 140 at the second support end 124b includes structure for interacting with the attachment system 128 for attaching the head support device 120 to a surface 30.

Figure 18A:
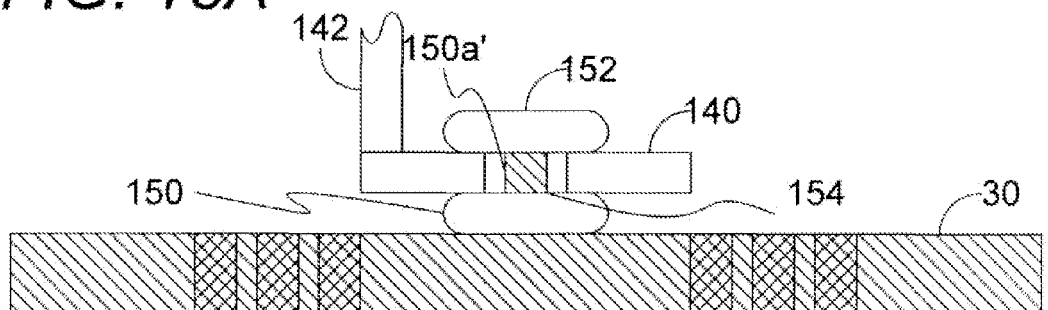
FIGS. 18A-18C are simplified side views showing relative movement of a base component between the exemplary surface attachment sub-system and the locking sub-system of an exemplary attachment system.
Figure 18B:
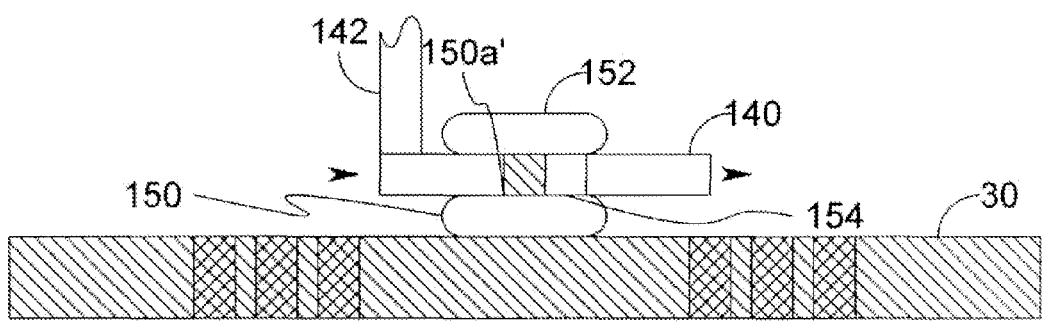
Figure 18C:
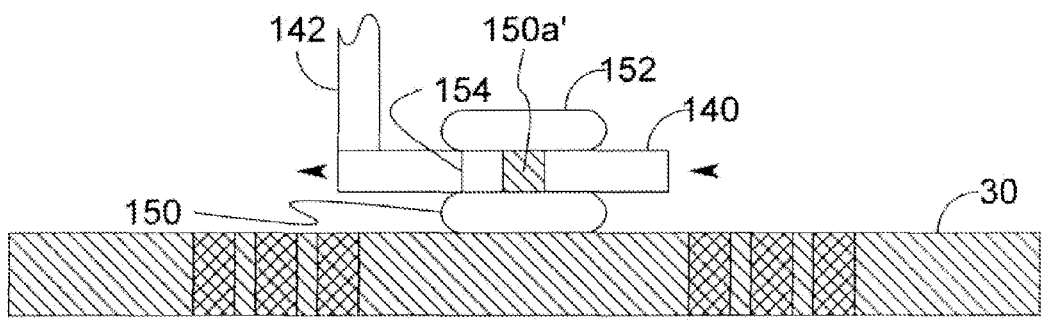
Figure 19A:
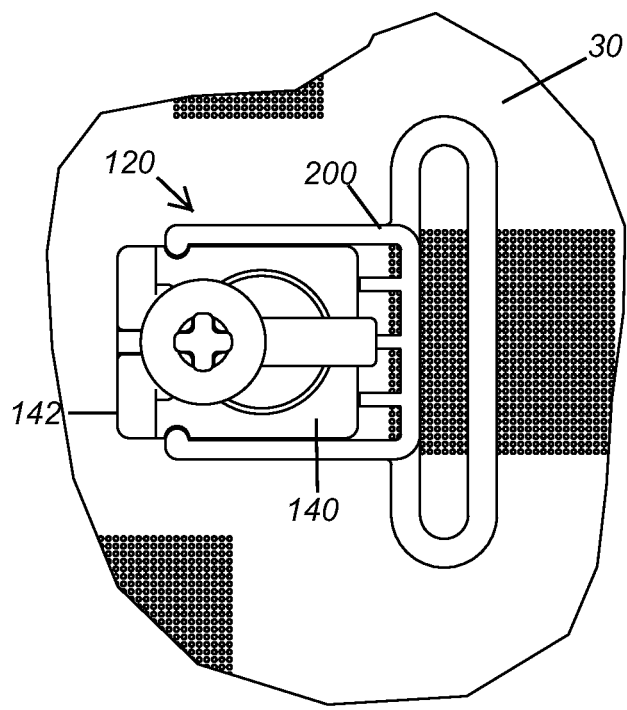
FIGS. 19A-19D are simplified top views showing relative movement of a positionable support member to a surface, FIGS. 19A and 19C showing the first preferred embodiment of a locater tool.
Figure 19B:
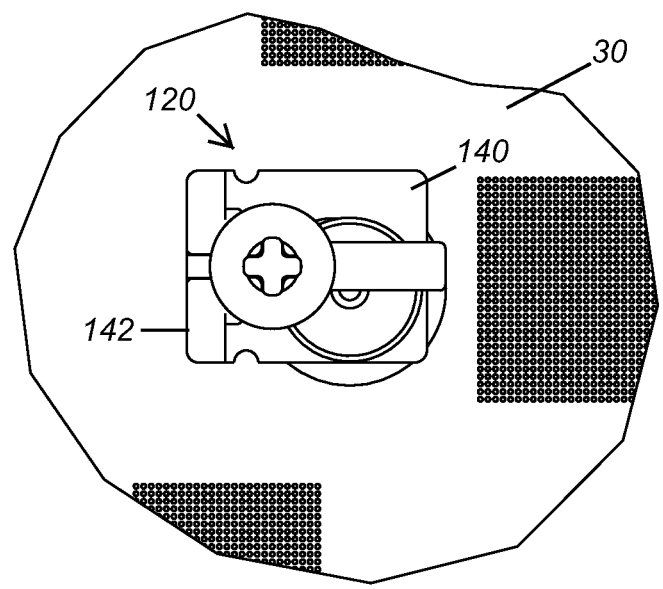
Figure 19C:
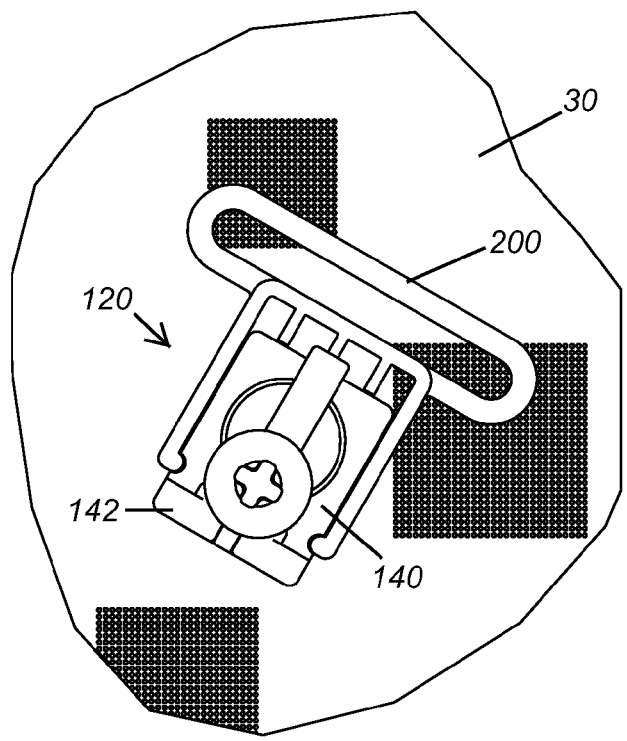
Figure 19D:
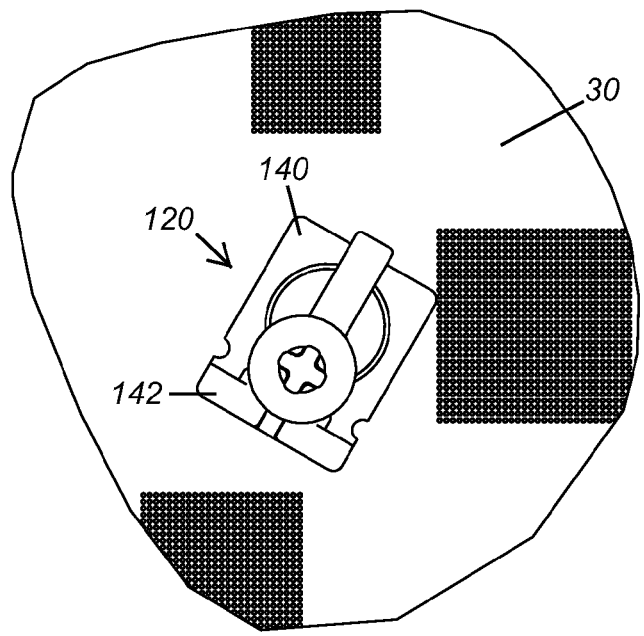

In the shown embodiment, the base component 140 is a platform having an opening 154 defined therein. The opening 154 has a larger diameter than the diameter of the upwardly projecting cylindrical member 150a' of the surface attachment sub-system 150. Once the upwardly projecting cylindrical member 150a' projects through the opening 154 (i.e. a user places the base component 140 on the surface attachment sub-system 150), the locking sub-system 152 may be joined with (e.g. screwed onto) the upwardly projecting cylindrical member 150a'. The locking sub-system 152 can be "loosened" (e.g. twisted to the left) so that the base component 140 is not squeezed and can move between the surface attachment sub-system 150 and the locking sub-system 152. The locking sub-system 152 can also be "tightened" (e.g. twisted to the right) so that the base component 140 is squeezed and cannot move (is held in a desired position) between the surface attachment sub-system 150 and the locking sub-system 152. As long as the locking sub-system 152 is "loose," the base component 140 is able to move freely in any direction perpendicular to the surface 30 (e.g. in the x-y plane) limited only by the upwardly projecting cylindrical member 150a' meeting an edge of the opening 154. FIGS. 18A-18C show the relative movement of a base component 140 between the exemplary surface attachment sub-system 150 and the locking sub-system 152 of an exemplary attachment system. Specifically, FIG. 18A shows the base component 140 in a central position, FIG. 18B shows the base component 140 pushed to an extreme right position, and FIG. 18C shows the base component 140 pushed to an extreme left position. FIGS. 19A-19D show movement of the positionable support member 124 in relation to a surface 30. Specifically, FIG. 19A shows the base component 140 (and the whole positionable support member 124) in a central position, FIG. 19B shows the base component 140 (and the whole positionable support member 124) pushed off-center, and FIGS. 19C and 19D show the base component 140 (and the whole positionable support member 124) rotated at an angle.

Figure 15:
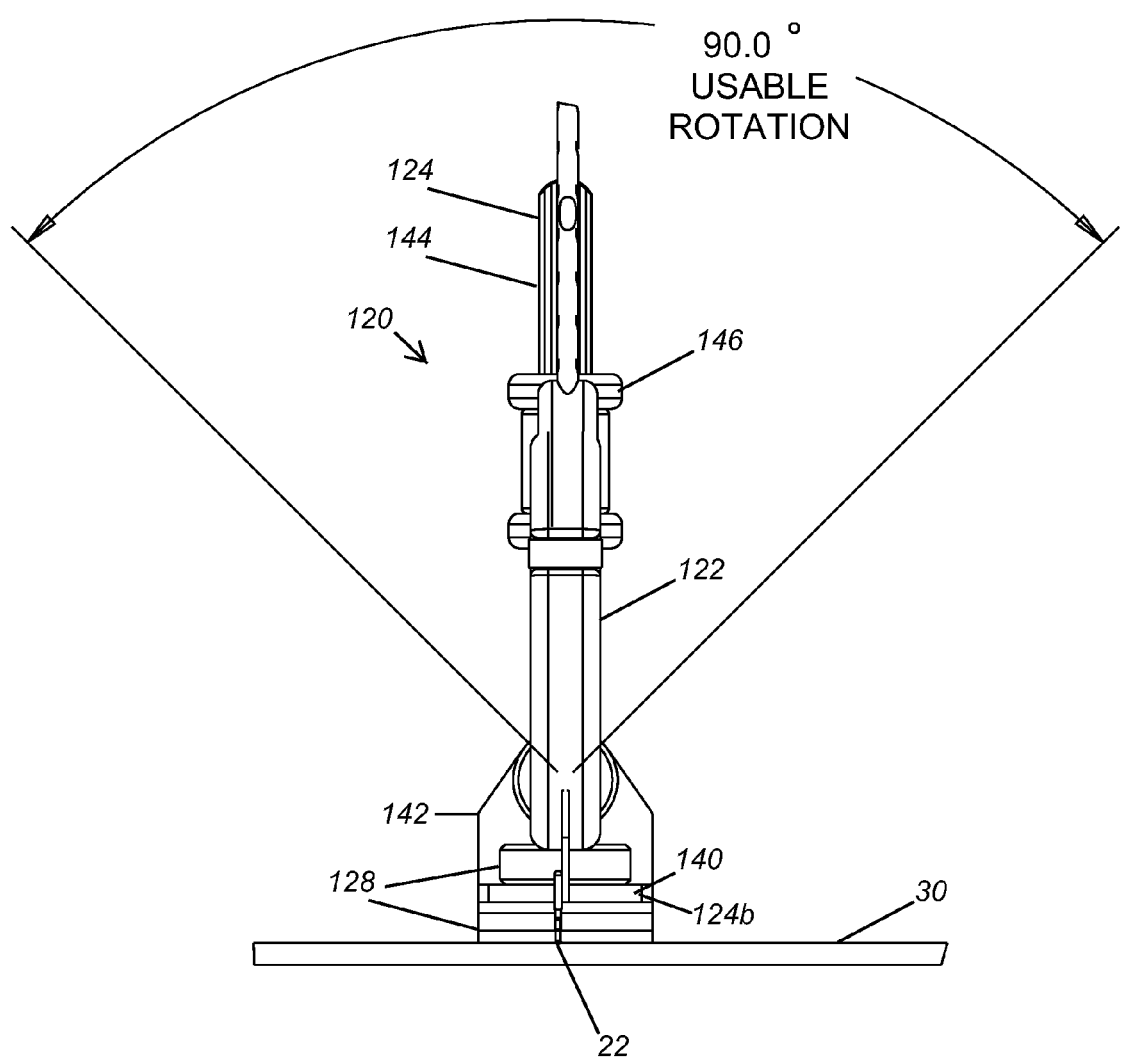
FIG. 15 is a front view of an exemplary head support device of the present invention showing rotational movement between a hinge support component of the positionable support member and a slide component of the positionable support member.

The hinge support component 142 is attached to the base component 140. In the shown embodiment, they are attached at a right angle. The hinge support component 142 includes the projection 160a of a constant torque hinge 160. The second part of the constant torque hinge 160 is the bracket 160b that is shown as being integral with the slide component 144. The constant torque hinge 160 allows rotational movement between the slide component 144 and the hinge support component 142. The bracket 160b is preferably designed to fit snugly around the projection 160a such that pressure may be used to rotate the bracket 160b relative to the projection 160a, but rotation is inhibited if there is little or no pressure. It should be noted that the weight of a test probe head 122 would not provide sufficient pressure. Accordingly, when the slide component 144 is rotated at an angle, the weight of the test probe head 122 would not provide enough pressure to cause the slide component 144 to rotate further. In preferred embodiments, the amount of pressure necessary should be easily provided by a user's fingertips. It should be noted that alternative embodiments could use alternative mechanisms that would allow the appropriate rotational movement between the slide component 144 and the hinge support component 142. FIG. 15 shows an exemplary range of rotational movement between the hinge support component 143 and the slide component 144. It should be noted that alternative embodiments could allow more or less of a range of rotational movement. The shown angle, however, is meant to show the usable (suitable for probing) rotational range for this particular embodiment of a head support device with this particular embodiment of a test probe head 122.

Figure 16:
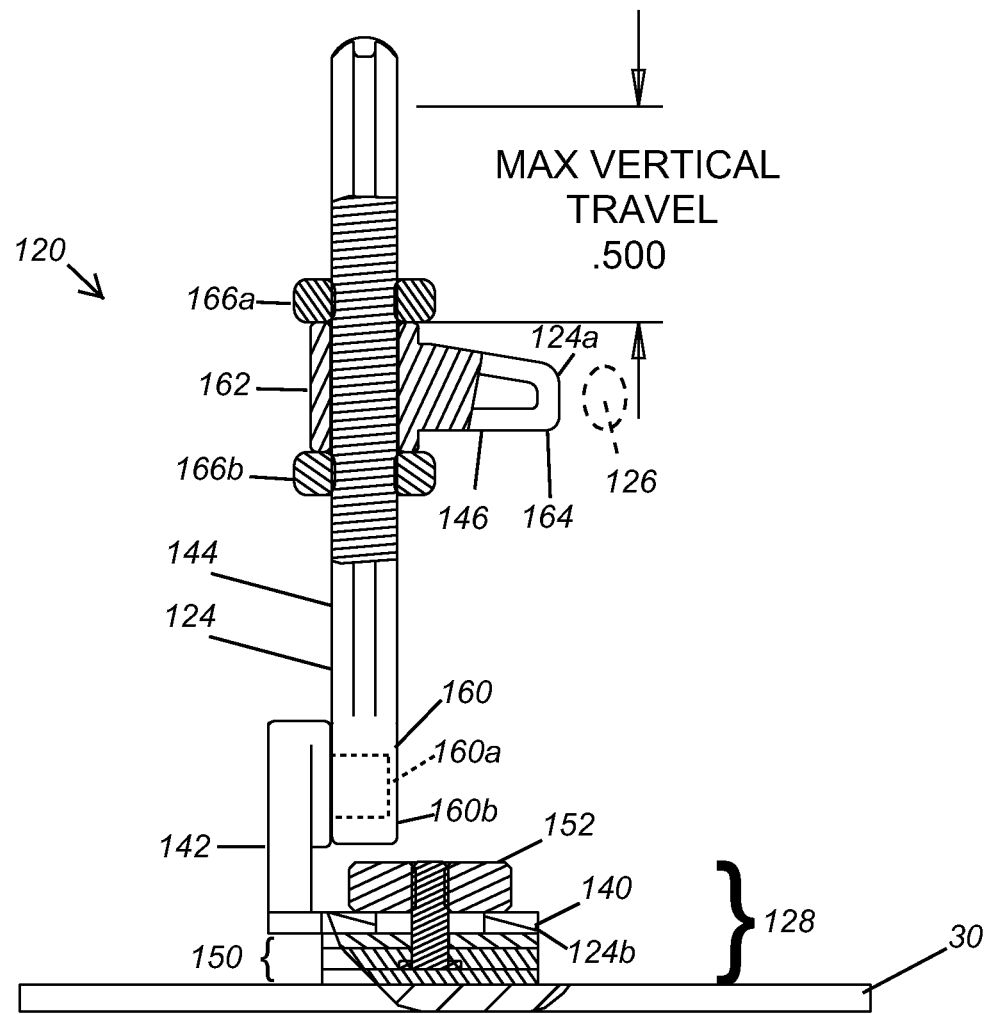
FIG. 16 is a side view in partial cross-section of an exemplary head support device of the present invention showing vertical movement between a slide component of the positionable support member and an extension component of the positionable support member.

The slide component 144 is shown as an elongated member having the bracket 160*b* of a constant torque hinge 160 at one end of its length. In the shown embodiment, the slide component 144 has a "+" cross-section, although alternative embodiments could use alternative cross-sections. As will be discussed, the extension component 146 travels "up" and "down" the length of the slide component 144. FIG. 16 shows a maximum vertical travel range of 0.5 inches (1.27 centimeters). It should be noted, however, that this vertical travel range is meant to be exemplary and is not meant to limit the scope of the invention.

In the shown embodiment (shown in detail in FIG. 16), the extension component 146 includes a slide bore 162, an extension 164, and friction mechanisms 166*a* and 166*b*. In preferred embodiments, the slide bore 162 is a "tube" with an internal diameter that is just large enough to allow the slide component 144 to be inserted therethough and to allow movement therebetween. In this shown embodiment, the slide bore 162 is integral with the extension 164 which extends substantially perpendicular to the longitudinal axis of the slide bore 162. The end of the extension 164 distal from the slide bore 162 supports the head adapter 126. The friction mechanisms 166*a* and 166*b* are designed to allow vertical movement when sufficient pressure is applied, but to prevent vertical movement if there is little or no pressure. It should be noted that the weight of a test probe head 122 would not provide sufficient pressure. Accordingly, the weight of the test probe head 122 would not provide enough pressure to cause the extension component 146 to move vertically downward on the slide component 144. In preferred embodiments, the amount of pressure necessary should be easily provided by a user's fingertips. In this shown embodiment, two elastic rings function as friction mechanisms 166*a* and 166*b*. The shown rings are positioned at the top and bottom annular ends of the slide bore 162. It should be noted, however, that there may be more or fewer friction mechanisms 166*a* and 166*b*. It should also be noted that alternative friction mechanisms 166*a* and 166*b* may be used. For example, if the slide component 144 and the slide bore 162 were threaded so that they engaged each other, the friction mechanisms 166*a* and 166*b* might be the threads themselves or the interaction therebetween.

As set forth herein, the shown preferred embodiment of the head support device 120 of the present invention has multiple points of movement. It should be noted, however, in alternative embodiments there may be points of movement that are either in addition to those disclosed herein or replace those disclosed herein. One exemplary point of movement could be between the extension component 146 and the head adapter 126. Another exemplary point of movement could be between the head adapter 126 and the test probe head 122. These alternative points of movement may be created, for example, by a hinge, a sliding mechanism, a length of bendable and shape retainable material, and/or ball and socket joint. In alternative embodiments some of the components may include additional "joints" or "points of movement" to allow additional movement (e.g. the extension component 146 and/or the head adapter 126 may include additional joints that allow the test probe head 122 to pivot, for example, to either side or completely upside-down). This would allow users an infinite variety of movements or combination of movements for probing with the test probe head 122.

D. Miscellaneous

It should be noted that an appropriately sized and shaped head support device 120 could be used to support a test probe tip. For example, the modified version of the head support device could support the test probe tip 22 (shown in the figures) or a modified version of the test probe tip (e.g. a fixed position contact version which would have pogo-pins in place of the leaded resistors).

It should be noted that in one preferred embodiment of the head support device 120 the extension component 146 could be removed from the slide component 144 (i.e. by sliding the slide bore 162 vertically upward until it extends beyond the slide component 144). The extension component 146 can then be "flipped" and repositioned on the slide component 144. The now "upside-down" extension component 146 would now support a test probe head 122 so that its associated test probe tip 22 points "upward." This would allow a user to probe connection points above the head support device 120.

It should be noted that the exemplary attachment system 128 could be used with a test probe tip 22, although adjustments would have to be made for the size and shape.

III. Locater Tool

One of the most frustrating aspects of using support devices 20, 20', 120 (in this section, unless otherwise specified, the support device 120 will include support devices 20, 20'), but that allow for hands-free operation of an electrical test probe is the difficulty in positioning support devices 120 for optimum use (e.g. the achievable probing zone 210 is positioned such that the most desired connection points can be reached). A user is faced with a trial and error positioning technique. The user positions a support device 120 (e.g. on a surface 30 of a circuit board) and, if it is not in the proper position (e.g. not all the desired connection points can be reached), the support device must be removed and repositioned. Sometimes the user believes the support device 120 is not in the proper position and removes the support device 120, but then later finds out that he was just using the support device 120 incorrectly and it would have been possible to use the support device 120 in its original position just by adjusting the support device 120 (e.g. using points of movement to change the accessible area of the achievable probing zone 210). Sometimes the user spends significant time adjusting the support device 120, only to find out that it is not possible to probe a desired connection points (i.e. the connection points are not within the achievable probing zone 210). The present invention corrects these problems by providing a locater tool that allows a user to see the achievable probing zone 210 before the support device 120 is positioned, repositioned, and/or adjusted.

A first preferred embodiment of the locater tool is a device-attachable locater tool 200 such as that shown in FIGS. 13, 14, 19A, and 19C. A second preferred embodiment of the locater tool is a pre-positioning locater tool (shown as 220*a*-220*f*, but referred to generally as 220) such as that shown in FIGS. 20-28. Both locater tool embodiments 200, 220 show a user an achievable probing zone 210 (the area on the surface 30 containing contact points that could be probed if the support device were positioned in the support device position an example of which can be found in FIG. 14).

A. Device-Attachable Locater Tool 200

The first preferred embodiment of the locater tool is a device-attachable locater tool 200 such as that shown in FIGS. 13, 14, 19A, and 19C.

The device-attachable locater tool 200 for positioning a support device 120 includes a template 202, support device attachment means 204 for indicating a support device position, and means 206 for indicating an achievable probing zone 210 when the support device 120 is in the support device position.

In the shown embodiment of the device-attachable locater tool 200 includes a template 202 that is a plastic or other suitable material piece. The exemplary template 202 includes both the support device attachment means 204 and the means 206 for indicating an achievable probing zone 210.

In the shown embodiment, the support device attachment means 204 for indicating a support device position are a pair of arms that are attachable and detachable from the base component 140. In the shown embodiment, the ends of the arms have slight protrusions and/or are bent inwards. The base component 140 has mating notches on both sides. The arms may be slightly flexible to allow the ends of the arms to be flexed outward for "installing" the device-attachable locater tool 200 and then compress inward for securing the device-attachable locater tool 200 to the support device 120. In alternative embodiments, the support device attachment means 204 may be an adhesive. Other types of clips, hooks, hook-and-loop fabric, or any other attachment mechanism may be used. Although shown as a removable and reattachable device, it should be noted that the support device attachment means 204 may be permanently attached to or integral with the support device 120 if it would not interfere with the use of the support device 120 and/or the process of probing.

The means 206 for indicating an achievable probing zone 210 when the support device 120 is in the support device position (e.g. attached to the surface 30) is shown as an opening or window. The surface and/or contact points exposed through the opening or window is the achievable probing zone 210. It should be noted that the shown opening or window is meant to be exemplary. For example, an opaque structure could be used such that any part of the surface covered by the opaque structure would be within the achievable probing zone 210.

A device-attachable locater tool 200 attaches to the support device 120 and allows the user to see the achievable probing zone 210. To use the device-attachable locater tool 200, a user would follow the following steps: (a) attach the device-attachable locater tool 200 to the support device 120; (b) temporarily position the support device 120 in what the user believes is a viable position on the surface 30; (c) verify that the achievable probing zone 210 is the desired achievable probing zone 210; (d) if the achievable probing zone 210 is not the desired achievable probing zone 210, return to step (c); (e) if the achievable probing zone 210 is the desired achievable probing zone 210, the user semi-permanently or permanently connects the support device 120 to the surface 30; and (f) optionally removes the device-attachable locater tool 200 from the support device 120.

B. Pre-Positioning Locater Tool 220

The second preferred embodiment of the locater tool is a pre-positioning locater tool (shown as 220a-220f, but referred to generally as 220) such as that shown in FIGS. 20-28.

The pre-positioning locater tool 220 (also shown as 220a-220f) for positioning a support device 120 includes a template 222, means 224 for indicating a support device position (e.g. a cut-out section, aperture, or void), and means 226 for indicating an achievable probing zone 210 when the support device 120 is in the support device position. The means 226 for indicating an achievable probing zone 210 may be, for example, a window or opening, an opaque cover, guidelines, and tinting. More details are discussed with the specific embodiments.

Figure 20:
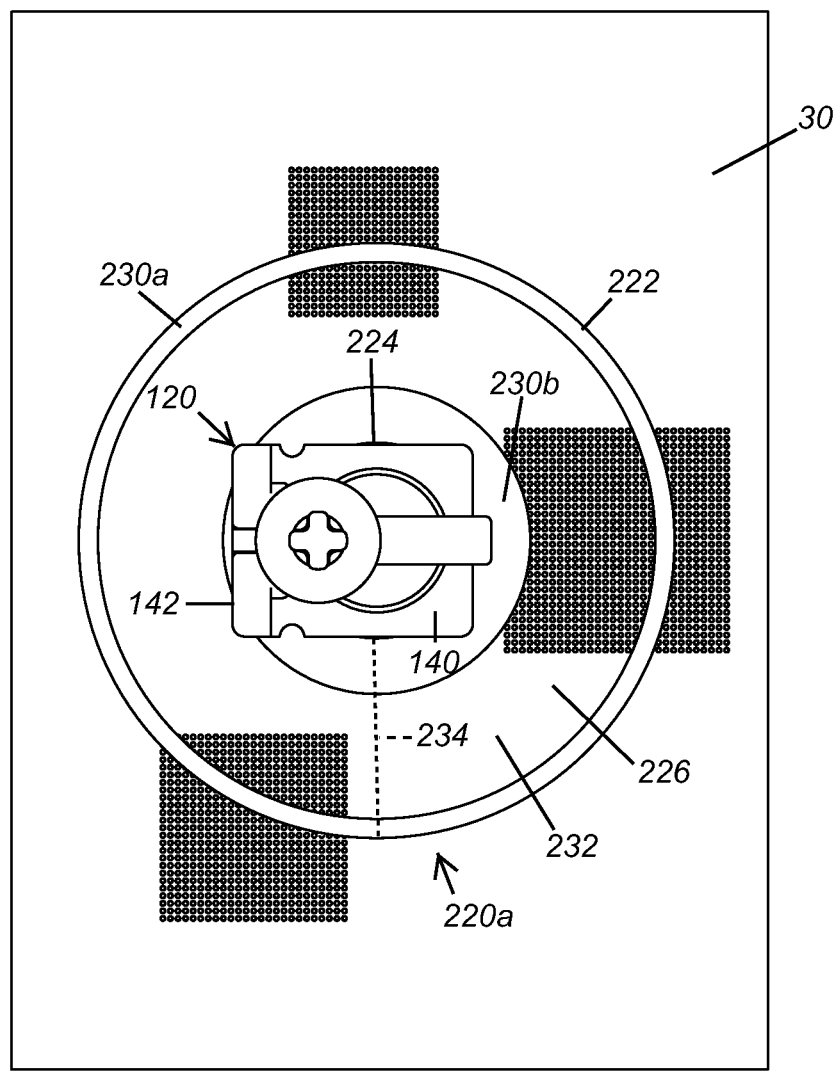
FIG. 20 is a simplified top view showing a support device and a "clear" version of the second preferred embodiment of a locater tool.

FIG. 20 shows a "clear" version of the pre-positioning locater tool 220a. The clear pre-positioning locater tool 220a includes a template 222, means 224 for indicating a support device position (e.g. a cut-out section, aperture, or void), and means 226 for indicating an achievable probing zone 210 when the support device 120 is in the support device position. The means 226 for indicating an achievable probing zone 210 in this example is a window (e.g. a plastic film) or an opening (e.g. cut out or omitted portions). In this embodiment, the template 222 includes an outer opaque annular ring 230a and an inner opaque annular ring 230b. A transparent or clear annular ring 232 is annularly situated between the outer and inner rings 230a, 230b. It should be noted that if openings were used instead of a transparent or clear window, then there might be thin ribs connecting the outer and inner rings 230a, 230b. A perforation 234 may be included from the inner diameter of the template 222 to the outer diameter of the template 222. This perforation 234 allows the user to "open" or "break" the template so that it can be removed once the positioning is complete. Alternatively, the template 222 can be gently lifted over the support device 120 or a portion thereof (e.g. the surface attachment sub-system 150). In one preferred embodiment, adhesive 240 (FIG. 27) is provided at least partially on one side of the template 222. The adhesive 240 should be a relatively light adhesive (tacky adhesive) such as that used on POST-IT® notes. This allows the user to attach the template 222 to the surface 30 temporarily, but securely.

Figure 21:
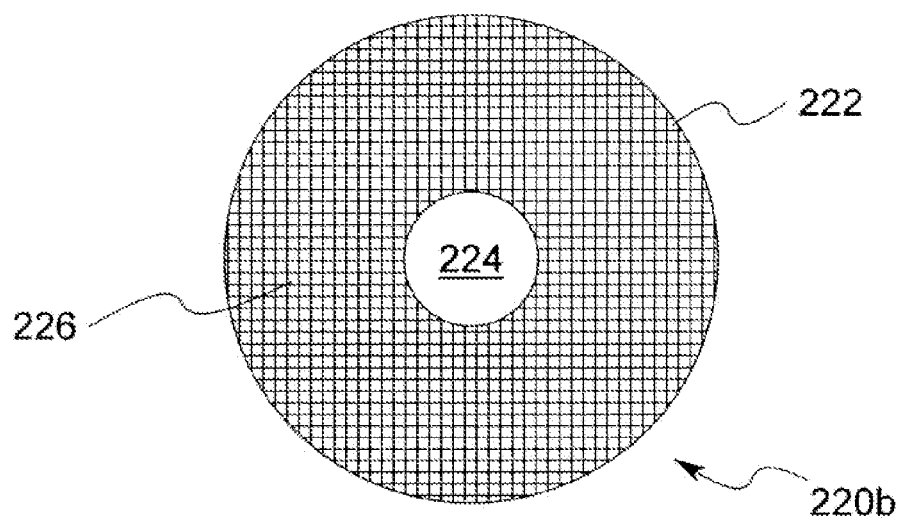
FIG. 21 is a simplified top view of an "opaque" version of the second preferred embodiment of a locater tool.

FIG. 21 shows an "opaque" version of the pre-positioning locater tool 220b. The opaque pre-positioning locater tool 220b includes a template 222, means 224 for indicating a support device position (e.g. a cut-out section, aperture, or void), and means 226 for indicating an achievable probing zone 210 when the support device 120 is in the support device position. The means 226 for indicating an achievable probing zone 210 in this example an opaque expanse. In one preferred embodiment of an opaque pre-positioning locater tool 220b, the opaque expanse is a piece of paper having the appropriate shape. A perforation (not shown) may be included from the inner diameter of the template 222 to the outer diameter of the template 222. This perforation 234 allows the user to "open" or "break" the template so that it can be removed once the positioning is complete. Alternatively, the template 222 can be gently lifted over the support device 120 or a portion thereof (e.g. the surface attachment sub-system 150). If the opaque pre-positioning locater tool 220b is made of paper, the opaque expanse can also be ripped. In one preferred embodiment, adhesive 240 (FIG. 27) is provided at least partially on one side of the opaque expanse. The adhesive 240 should be a relatively light adhesive (tacky adhesive) such as that discussed above. It should be noted that one preferred embodiment of the opaque pre-positioning locater tool 220b would be a set of opaque pre-positioning locater tool 220b sold together like a pad of paper, each sheet lightly adhered to the sheet below.

Figure 22:
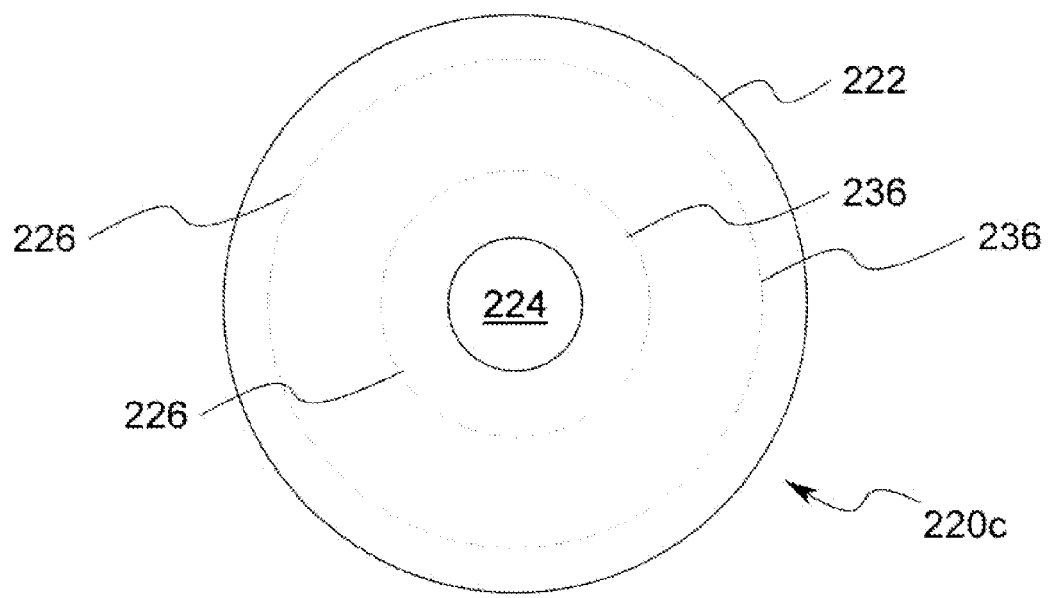
FIG. 22 is a simplified top view of a "guideline" version of the second preferred embodiment of a locater tool.

FIG. 22 shows a "guideline" version of the pre-positioning locater tool 220c. The guideline pre-positioning locater tool 220c includes a template 222, means 224 for indicating a support device position (e.g. a cut-out section, aperture, or void), and means 226 for indicating an achievable probing zone 210 when the support device 120 is in the support device position. The means 226 for indicating an achievable probing zone 210 in this example is defined between a set of guidelines 236 that may be, for example, printed on the clear template 222. A perforation 234 (not shown) may be included from the inner diameter of the template 222 to the outer diameter of the template 222. This perforation 234 allows the user to "open" or "break" the template so that it can be removed once the positioning is complete. Alternatively, the template 222 can be gently lifted over the support device 120 or a portion thereof (e.g. the surface attachment sub-system 150). In one preferred embodiment, adhesive 240 (FIG. 27) is provided at least partially on one side of the template 222. The adhesive 240 should be a relatively light adhesive (tacky adhesive) such as that used on POST-IT® notes. This allows the user to attach the template 222 to the surface 30 temporarily, but securely.

Figure 23:
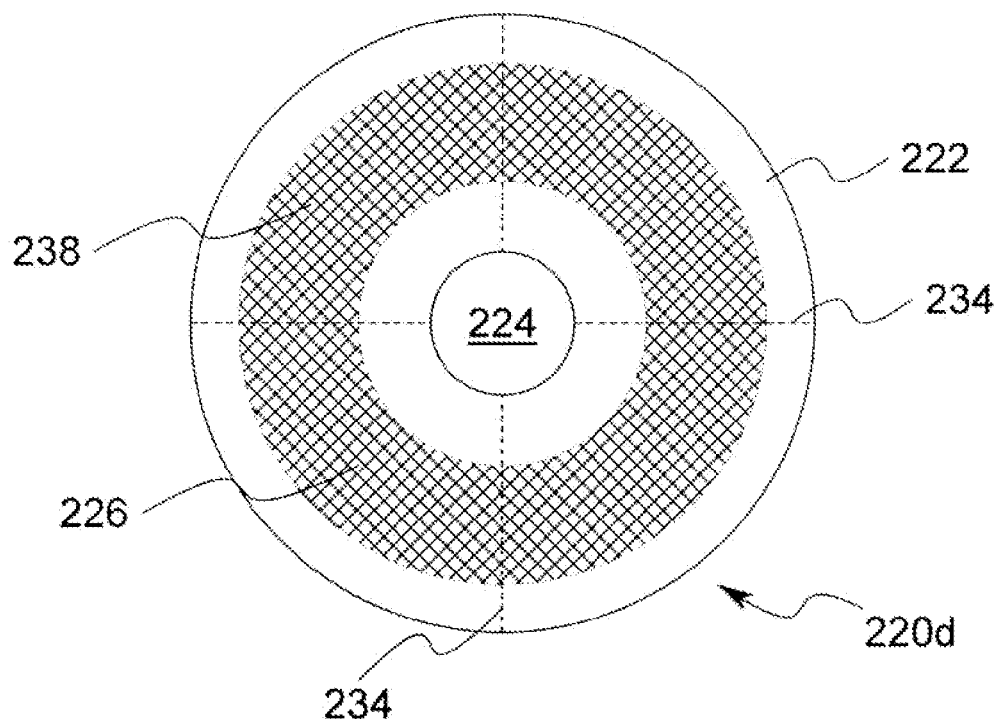
FIG. 23 is a simplified top view of a "tinted" version of the second preferred embodiment of a locater tool, this embodiment also having multiple perforations.
Figure 24:
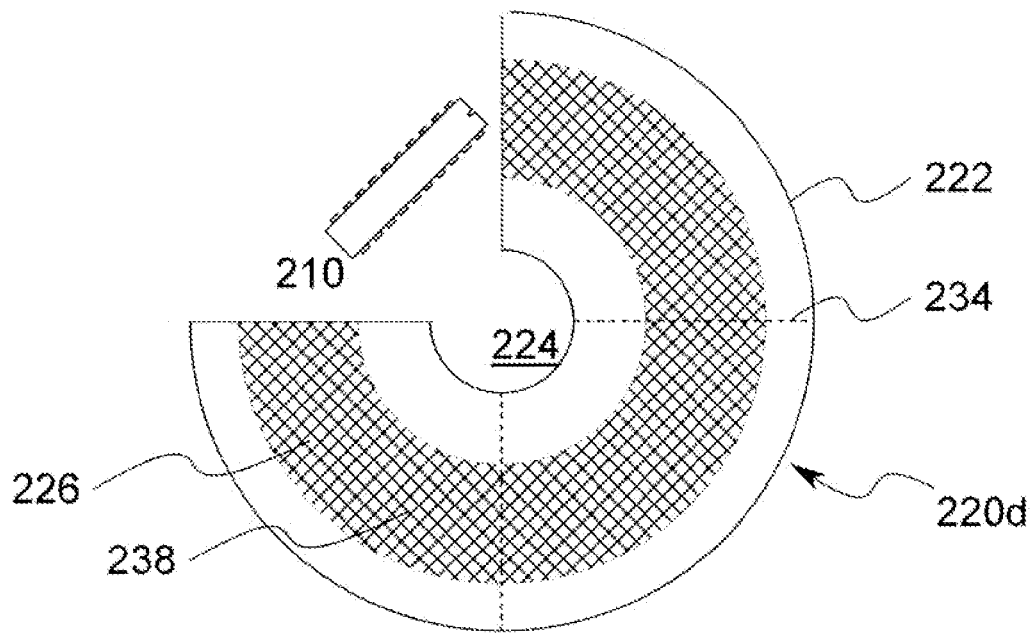
FIG. 24 is a simplified top view of the "tinted" version of FIG. 23, a section of the locater tool being removed for probing.

FIGS. 23 and 24 show a "tinted" version of the pre-positioning locater tool 220d, this embodiment also having multiple sets of perforations 234. FIG. 24 shows one of the sections formed between the perforations 234 removed. The pre-positioning locater tool 220d may be used like this (with at least one missing section) with the remaining portions serving as protection for the components thereunder. The tinted pre-positioning locater tool 220d includes a template 222, means 224 for indicating a support device position (e.g. a cut-out section, aperture, or void), and means 226 for indicating an achievable probing zone 210 when the support device 120 is in the support device position. The means 226 for indicating an achievable probing zone 210 in this example is a tinted area 238 that may be, for example, printed on the clear template 222. In one preferred embodiment, adhesive 240 (FIG. 27) is provided at least partially on one side of the template 222. The adhesive 240 should be a relatively light adhesive (tacky adhesive) such as that used on POST-IT® notes. This allows the user to attach the template 222 to the surface 30 temporarily, but securely.

Figure 25:
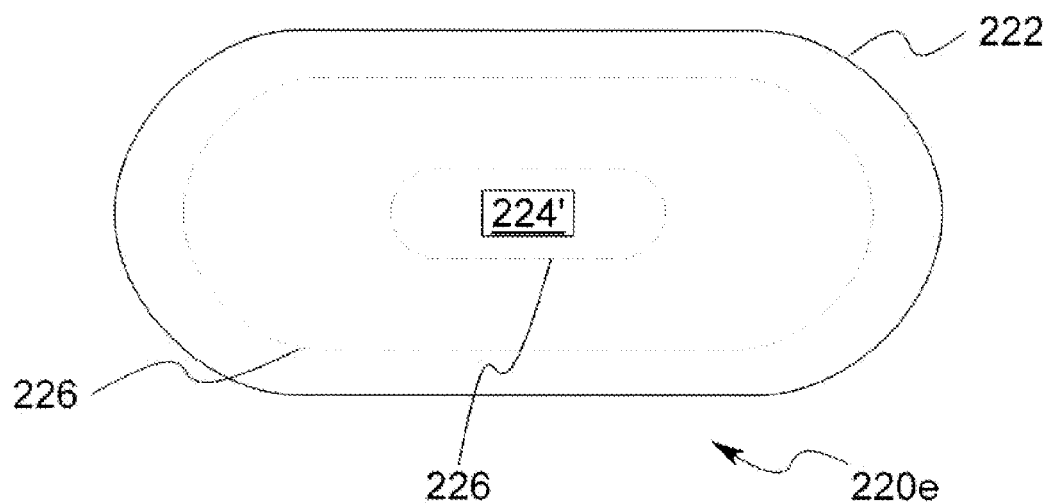
FIG. 25 is a simplified top view of the "guideline" version of the second preferred embodiment of a locater tool having an alternative shape.

FIG. 25 shows the "guideline" version of the pre-positioning locater tool 220e having an alternative shape. This alternative shape pre-positioning locater tool 220e embodiment has many of the same characteristics as the guideline pre-positioning locater tool 220c. This embodiment is included to show that the template 222 does not necessarily have to be circular. Depending on the support device 120, the shape of the template 222 would be determined by the achievable probing zone 210. This embodiment is also included that the means 224' for indicating a support device position (e.g. a cut-out section, aperture, or void) would be determined by the shape of the "footprint" of the support device 120. The means 224' for indicating a support device position is rectangular and could mate with the "footprint" of a tip support device 20 such as that shown in FIG. 3. The shapes and sizes are meant to be exemplary and not to limit the scope of the invention.

Figure 26:
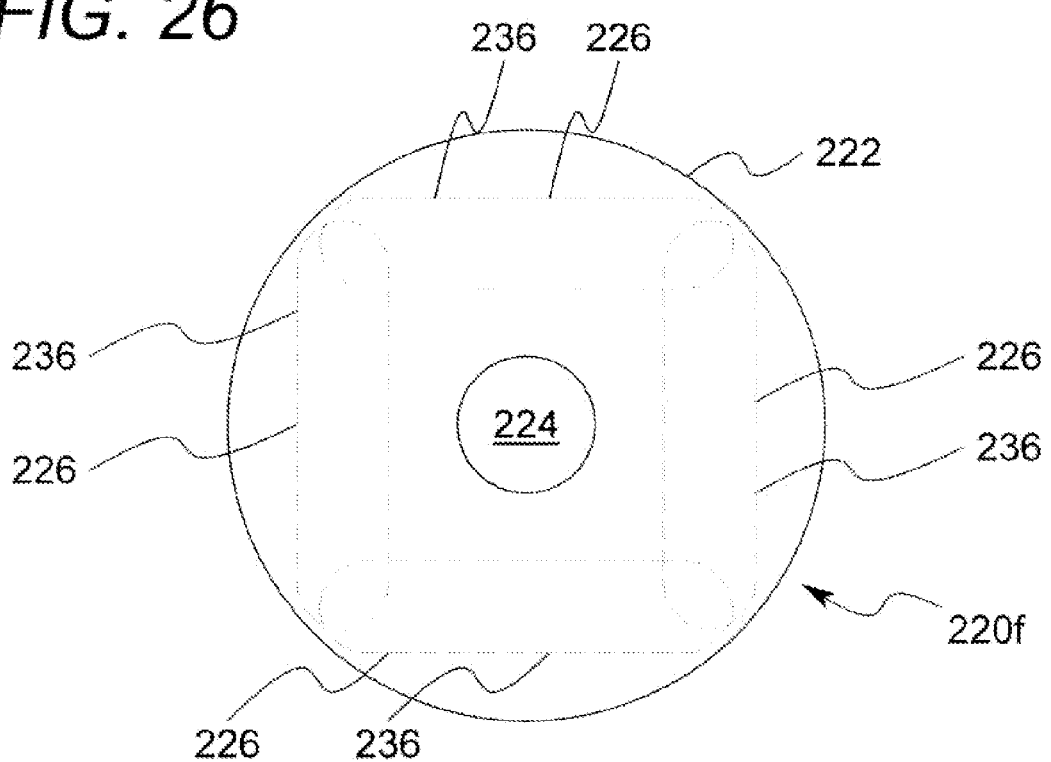
FIG. 26 is a simplified top view of the "guideline" version of the second preferred embodiment of a locater tool with alternative guidelines.

FIG. 26 shows the "guideline" version of the pre-positioning locater tool 220f with alternative guidelines. This alternative guideline pre-positioning locater tool 220f embodiment has many of the same characteristics as the pre-positioning locater tool 220c. This embodiment is included to show that the guidelines 236 are preferably determined by the achievable probing zone 210. This version might be for a support device that has four distinct positions at right angles to each other. The shapes and sizes are meant to be exemplary and not to limit the scope of the invention.

Figure 27:
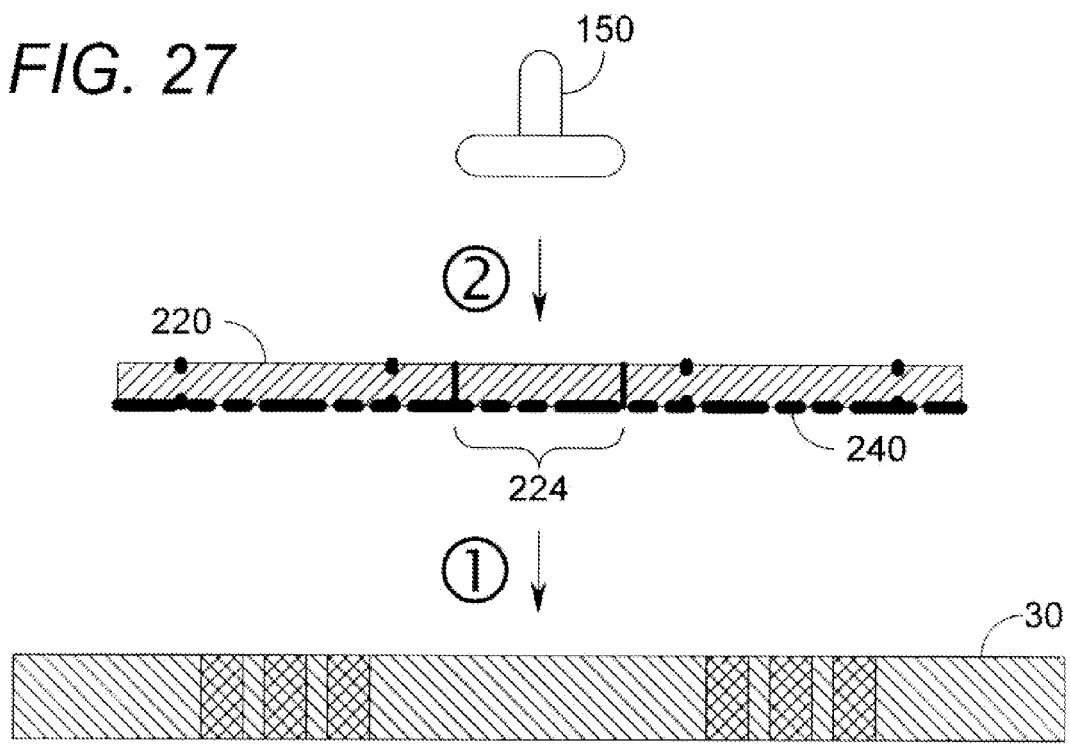
FIG. 27 is a cross-sectional exploded side view of the second preferred embodiment of a locater tool that shows the first step of placing the locater tool and the second step of placing the support device or a portion thereof.
Figure 28:
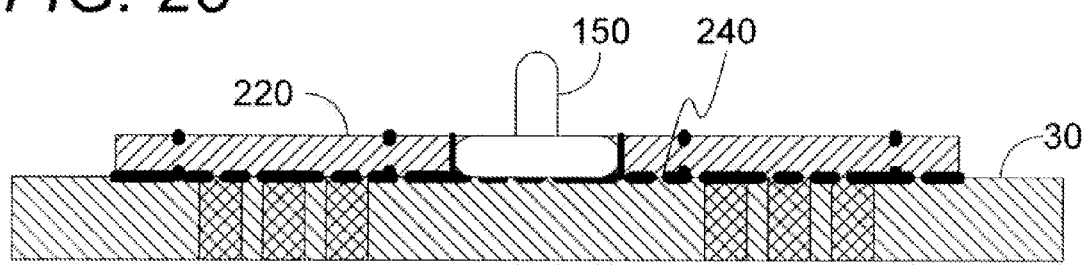
FIG. 28 is a cross-sectional side view of that shows the second preferred embodiment of a locater tool placed on the surface of a circuit board and the support device or a portion thereof positioned correctly.

FIG. 27 graphically shows the process of using the pre-positioning locater tool 220. Specifically, this figure shows the first step of placing the locater tool 220 and the second step of placing the support device 120 or a portion thereof (e.g. the surface attachment sub-system 150) on a surface 30 of a circuit board. It should be noted that if the steps were reversed (i.e. attaching the locater tool 220 to the support device 120 or a portion thereof and then attaching the joined devices to the surface 30), this would essentially be an alternative embodiment of the device-attachable locater tool 200. FIG. 28 is a cross-sectional side view of that shows the pre-positioning locater tool 220 placed on the surface 30 of a circuit board and the support device 120 or a portion thereof (e.g. the surface attachment sub-system 150) positioned correctly.

A pre-positioning locater tool 220 attaches to the support device 120 and allows the user to see the achievable probing zone 210. To use the pre-positioning locater tool 220, a user would follow the following steps: (a) attach the pre-positioning locater tool 220 to the surface 30 in what the user believes is a viable position on the surface 30; (b) verify that the achievable probing zone 210 is the desired achievable probing zone 210; (c) if the achievable probing zone 210 is not the desired achievable probing zone 210, return to step (a); (d) if the achievable probing zone 210 is the desired achievable probing zone 210, the user semi-permanently or permanently connects the support device 120 or a portion thereof (e.g. the surface attachment sub-system 150) to the surface 30; and (e) optionally removes the pre-positioning locater tool 220 from the support device 120.

C. Miscellaneous

It should be noted that the means 226 for indicating an achievable probing zone 210 are not necessarily exclusive. For example, guidelines may be used with tinting. Using a combination of means 226 for indicating an achievable probing zone 210 might be particularly effective for showing gradations (e.g. using colored tinting) in connections if there are gradations within the achievable probing zone 210 that relate to quality of connection, strength of connection, type of connection, or other variable quality.

It should be noted that a device-attachable locater tool 200 is not necessarily distinct and exclusive from a pre-positioning locater tool 220. For example, the method of using pre-positioning locater tool 220a shown in FIG. 20 would most likely include first placing the locater tool 220a on a surface 30 and then placing the support device 120 or a portion thereof (e.g. the surface attachment sub-system 150) on a surface 30 of a circuit board using the means for indicating a support device position 224. If the steps were reversed, however, such that the locater tool 220 is first attached to the support device 120 or a portion thereof and then the joined devices were attached to the surface 30, the locater tool 220a would essentially be a device-attachable locater tool 200.

The terms and expressions that have been employed in the foregoing specification are used as terms of description and not of limitation, and are not intended to exclude equivalents of the features shown and described or portions of them. For example, it should be noted that relative terms (e.g. upper and lower) are meant to help in the understanding of the technology and are not meant to limit the scope of the invention. Similarly, the term "front" is meant to be relative to the term "back," the term "vertical" is meant to be relative to the term "horizontal", the term "up" is meant to be relative to the term "down", and the term "top" is meant to be relative to the term "bottom." The scope of the invention is defined and limited only by the claims that follow.

What is claimed is:

1. An assistive fine positioning support device for positioning and/or holding a test probe tip suitable for making an electrical contact with electrical components, said test probe tip distanced from associated with a probing head of an electrical test probe, the electrical test probe having a cable with the probing head at one end and a testing instrument connector at the other end, the testing instrument connector being suitable for connecting to a testing instrument, the support device comprising:

(a) at least one bendable and shape retainable positionable support member having a first support end and a second support end;
(b) a tip adapter at said first support end for connecting said test probe tip to said at least one positionable support member, said tip adapter in direct contact with said test probe tip;
(c) said second support end having means for holding and securing to a surface supporting an electrical component to be probed; and
(d) said test probe tip being remote from said probing head, wherein said assistive fine positioning device supports said test probe tip without supporting said probing head.

2. The support device of claim 1 wherein generally an entire length of said positionable support member is bendable.

3. The support device of claim 1 wherein generally an entire length of said positionable support member is shape retainable.

4. The support device of claim 1 wherein said positionable support member includes a plurality of support member segments and at least one pivot therebetween.

5. The support device of claim 1, said tip adapter being an interchangeable connector that may be removed from said at least one positionable support member.

6. The support device of claim 1, wherein said tip adapter is a fine-positionable tip adapter that can be raised and lowered relative to said support member by twisting a screw.

7. The support device of claim 1, said test probe tip including a first part of a passive two-part connection mechanism, said tip adapter including a second part of said two-part connection mechanism, said first part and said second part being interconnectable.

8. The support device of claim 1, said test probe tip defining a connection void, said tip adapter including a connection protrusion, said connection protrusion being insertable into said connection void.

9. The support device of claim 1, wherein said second support end is adherable to said surface.

10. The support device of claim 1 further comprising adhesive, said adhesive for attaching said second support end to said surface.

11. The support device of claim 1 further comprising removable adhesive, said removable adhesive for attaching said second support end to said surface.

12. The support device of claim 1, wherein said second support end is attachable through said surface.

13. The support device of claim 1, wherein said tip adapter is a fine-positionable tip adapter that can be raised and lowered relative to said support member by twisting a screw.

14. The support device of claim 1, wherein said test probe tip does not include a differential amplifier.

15. The support device of claim 1, wherein said surface is a circuit board.

16. An assistive fine positioning device for positioning and/or holding a test probe tip suitable for making an electrical contact with electrical components, said test probe tip distanced from an associated probing head of an electrical test probe, the electrical test probe having a cable with the probing head at one end and a testing instrument connector at the other end, the testing instrument 6 connector being suitable for connecting to a testing instrument, said device comprising:
(a) at least one bendable and shape retainable support member having a first support end and a second support end;
(b) a tip adapter at said first support end for connecting said at least one support member to said test probe tip, said tip adapter in direct contact with said test probe tip;
(c) an adhesive mechanism at said second support end, said adhesive mechanism for attaching said second support end to a surface supporting an electrical component to be probed; and
(d) said test probe tip remote being from said probing head, wherein said device supports said test probe tip without supporting said associated probing head.

17. The device of claim 16, wherein said tip adapter is a fine-positionable tip adapter that can be raised and lowered relative to said support member by twisting a screw.

18. An assistive fine positioning device for positioning and/or holding a test probe tip suitable for making an electrical contact with electrical components, said test probe tip associated with a probing head of an electrical test probe, the electrical test probe having a cable with the probing head at one end and a testing instrument connector at the other end, the testing instrument connector being suitable for connecting to a testing instrument, said test probe tip defining a connection void, said device comprising:
(a) at least one bendable and shape retainable support member having a first support end and a second support end;
(b) a tip adapter at said first support end for connecting said at least one support member to said test probe tip, said tip adapter including a connection protrusion, said connection protrusion suitable for mating with said connection void; and
(c) an adhesive mechanism at said second support end, said adhesive mechanism for attaching said second support end to a surface supporting an electrical component to be probed;
(d) wherein said device supports said test probe tip without supporting said probing head.

19. The support device of claim 1, said test probe tip including a first part of a passive two-part connection mechanism, said tip adapter including a second part of said two-part connection mechanism, said first part and said second part being interconnectable, and said test probe tip further including connection edges along an outer periphery of said test probe tip, said tip adapter further including at least one connection grip suitable for mating with said connection edges.

20. The support device of claim 1, said test probe tip defining a connection void, said tip adapter including a connection protrusion, said connection protrusion is substantially surrounded by an interior wall of the void.

21. The device of claim 16, said test probe tip defining a connection void, said tip adapter including a connection protrusion, said connection protrusion being insertable into said connection void.

22. The device of claim 18, said test probe tip being remote from said probing head.

* * * * *